US012607893B2

(12) United States Patent
Kawasaki et al.

(10) Patent No.: US 12,607,893 B2
(45) Date of Patent: Apr. 21, 2026

(54) ACTIVE MATRIX SUBSTRATE AND LIQUID CRYSTAL DISPLAY DEVICE

(71) Applicant: Sharp Display Technology Corporation, Kameyama City (JP)

(72) Inventors: Tatsuya Kawasaki, Kameyama City (JP); Tohru Daitoh, Kameyama City (JP); Hajime Imai, Kameyama City (JP); Teruyuki Ueda, Kameyama City (JP); Masaki Maeda, Kameyama City (JP); Yoshiharu Hirata, Kameyama City (JP); Yoshihito Hara, Kameyama City (JP)

(73) Assignee: SHARP DISPLAY TECHNOLOGY CORPORATION, Kameyama City (JP)

( * ) Notice: Subject to any disclaimer, the term of this patent is extended or adjusted under 35 U.S.C. 154(b) by 204 days.

(21) Appl. No.: 18/746,216

(22) Filed: Jun. 18, 2024

(65) Prior Publication Data

US 2024/0337885 A1     Oct. 10, 2024

Related U.S. Application Data

(62) Division of application No. 17/903,085, filed on Sep. 6, 2022, now Pat. No. 12,044,943.

(30) Foreign Application Priority Data

Sep. 7, 2021     (JP) ................................. 2021-145486

(51) Int. Cl.
G02F 1/1362        (2006.01)
G02F 1/1343        (2006.01)
(Continued)

(52) U.S. Cl.
CPC .. *G02F 1/136286* (2013.01); *G02F 1/134336* (2013.01); *G02F 1/136213* (2013.01);
(Continued)

(58) Field of Classification Search
CPC ......... G02F 1/136213; G02F 1/136286; G02F 1/13629; G02F 1/136295; H10D 86/423
See application file for complete search history.

(56) References Cited

U.S. PATENT DOCUMENTS

2004/0169798 A1* 9/2004 Iwasa ................ G02F 1/136277
349/113

OTHER PUBLICATIONS

Kawasaki et al., "Active Matrix Substrate and Liquid Crystal Display Device", U.S. Appl. No. 17/903,085, filed Sep. 6, 2022.

* cited by examiner

*Primary Examiner* — Paisley L Wilson

(74) *Attorney, Agent, or Firm* — Keating & Bennett, LLP

(57) ABSTRACT

An active matrix substrate includes pixel regions each including a pixel electrode and an oxide semiconductor TFT including an oxide semiconductor layer. Each pixel electrode is electrically connected to one of adjacent two of source bus lines. The oxide semiconductor layer in the oxide semiconductor TFT of each pixel region overlaps the pixel electrode of a first adjacent pixel region. The pixel electrode of the each pixel region partially overlaps the oxide semiconductor layer in a second adjacent pixel region. The source bus lines include first and second source bus lines adjacent to each other. Pixels sets each including two pixel regions whose pixel electrodes are connected to the first source bus line and pixel sets each including two pixel regions whose pixel electrodes are connected to the second source bus line are arranged alternately between the first and second source bus lines.

2 Claims, 13 Drawing Sheets

(51) Int. Cl.
   *G02F 1/1368*    (2006.01)
   *G09G 3/36*    (2006.01)
   *H10D 86/40*    (2025.01)
   *H10D 86/60*    (2025.01)

(52) U.S. Cl.
   CPC ....... *G02F 1/13685* (2021.01); *G09G 3/3614*
      (2013.01); *H10D 86/423* (2025.01); *H10D*
                                     *86/60* (2025.01)

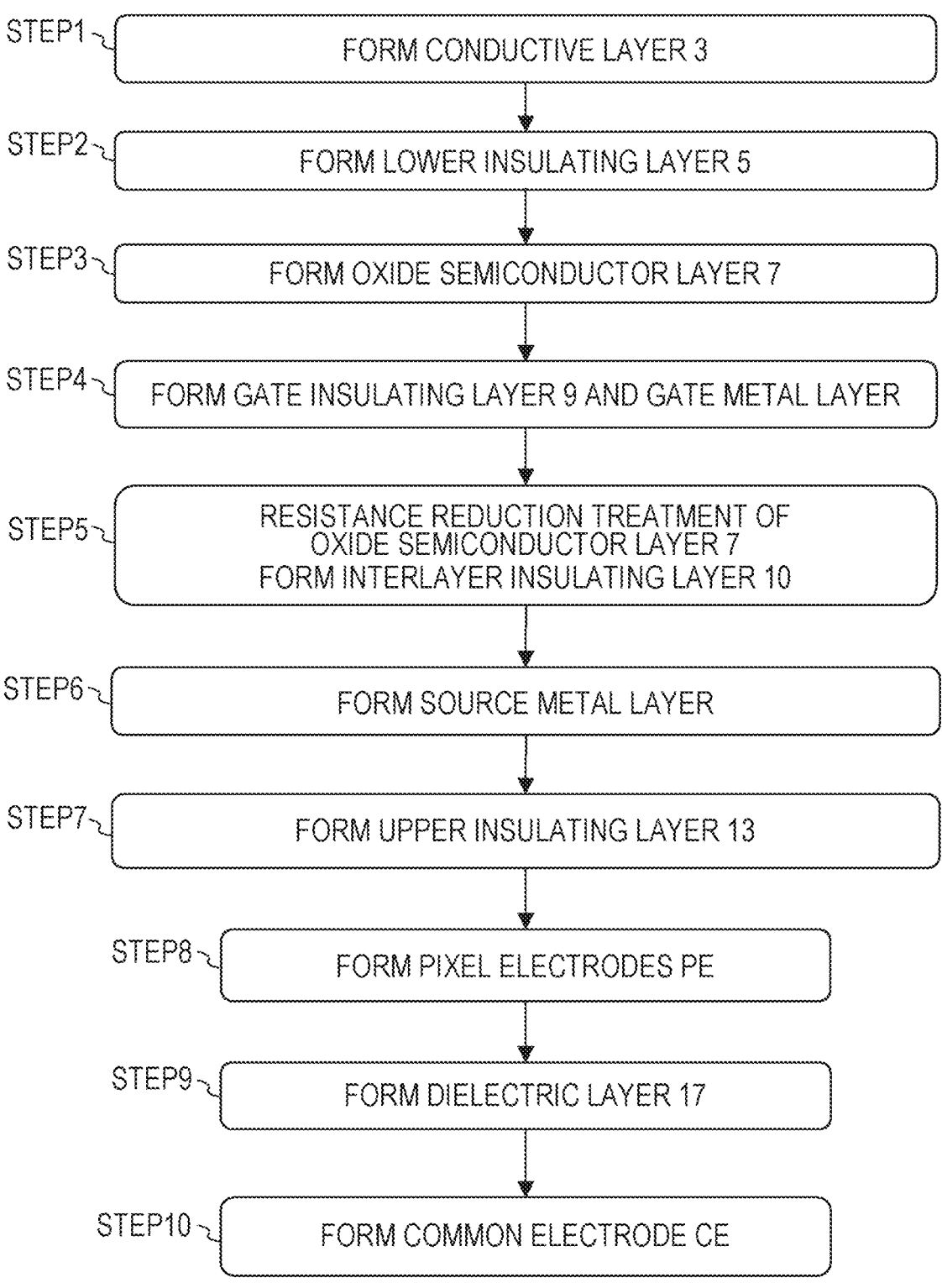

STEP1 — FORM CONDUCTIVE LAYER 3

STEP2 — FORM LOWER INSULATING LAYER 5

STEP3 — FORM OXIDE SEMICONDUCTOR LAYER 7

STEP4 — FORM GATE INSULATING LAYER 9 AND GATE METAL LAYER

STEP5 — RESISTANCE REDUCTION TREATMENT OF
OXIDE SEMICONDUCTOR LAYER 7
FORM INTERLAYER INSULATING LAYER 10

STEP6 — FORM SOURCE METAL LAYER

STEP7 — FORM UPPER INSULATING LAYER 13

STEP8 — FORM PIXEL ELECTRODES PE

STEP9 — FORM DIELECTRIC LAYER 17

STEP10 — FORM COMMON ELECTRODE CE

ACTIVE MATRIX SUBSTRATE AND LIQUID CRYSTAL DISPLAY DEVICE

BACKGROUND

1. Field

The present disclosure relates to an active matrix substrate and a liquid crystal display device.

2. Description of the Related Art

An active matrix substrate used for a display device such as a liquid crystal display device includes thin film transistors (hereinafter referred to as TFTs) serving as switching elements provided for respective pixels. It has been proposed to use, as the material of an active layer of TFTs, an oxide semiconductor instead of amorphous silicon and polycrystalline silicon. These TFTs are referred to as "oxide semiconductor TFTs." Most of the oxide semiconductor TFTs are bottom gate TFTs, but top gate oxide semiconductor TFTs have been proposed (for example, International Publication No. WO2017/085591).

Mobility in oxide semiconductors is higher than that in amorphous silicon. Therefore, oxide semiconductor TFTs can operate at a higher speed than amorphous silicon TFTs. Moreover, oxide semiconductor films are produced by a simpler process than polycrystalline silicon films and are therefore applicable to devices that require large areas.

Moreover, oxide semiconductor TFTs have good off-leakage characteristics. Therefore, when such oxide semiconductor TFTs are used as pixel TFTs, an operating mode in which images are displayed with a reduced image rewrite frequency can be used. Specifically, in this operating mode, drive periods and pause periods are provided. In the drive periods, scanning lines (gate bus lines) are scanned to write signal voltages. In the pause periods, all the scanning lines are not scanned, and writing is paused. This driving method is called pause driving or low-frequency driving and allows the power consumption of the liquid crystal display device to be largely reduced (see Japanese Unexamined Patent Application Publication No. 2019-184725).

In a display device using an active matrix substrate, parasitic capacitance causes fluctuations in pixel potential, and this may lead to a reduction in display quality. This problem is particularly significant when low-frequency driving is performed. It is known that, when the low-frequency driving is performed, blinking called flicker caused by fluctuations in pixel potential due to parasitic capacitance is likely to occur on the display during a pause period in the low-frequency driving.

It is desirable to provide an active matrix substrate including pixels provided with respective oxide semiconductor TFTs and capable of reducing deterioration in display quality and to provide a liquid crystal display device using the active matrix substrate.

SUMMARY

According to an aspect of the disclosure, there is provided an active matrix substrate including:

a substrate having a plurality of pixel regions arranged in a row direction and a column direction in a matrix form;

a plurality of gate bus lines supported on the substrate and extending in the row direction;

a plurality of source bus lines supported on the substrate and extending in the column direction, and an insulating layer, wherein each of the pixel regions is defined by corresponding adjacent two of the gate bus lines and corresponding adjacent two of the source bus lines, wherein the each of the pixel regions includes a pixel electrode and an oxide semiconductor TFT including an oxide semiconductor layer serving as an active layer, the pixel electrode being electrically connected to a first one of the corresponding adjacent two of the source bus lines through the oxide semiconductor TFT, wherein the oxide semiconductor layer in the oxide semiconductor TFT of the each of the pixel regions overlaps the pixel electrode of a first adjacent pixel region of the plurality of pixel regions with the insulating layer interposed therebetween, the first adjacent pixel region being adjacent to the each of the pixel regions with a first one of the corresponding adjacent two of the gate bus lines interposed therebetween, wherein the pixel electrode of the each of the pixel regions partially overlaps the oxide semiconductor layer in a second adjacent pixel region of the plurality of pixel regions with the insulating layer interposed therebetween, the second adjacent pixel region being adjacent to the each of the pixel regions with a second one of the corresponding adjacent two of the gate bus lines interposed therebetween, wherein the plurality of source bus lines include a first source bus line and a second source bus line that are adjacent to each other, and wherein pixels sets each including two of the pixel regions whose pixel electrodes are connected to the first source bus line and pixel sets each including two of the pixel regions whose pixel electrodes are connected to the second source bus line are arranged alternately between the first source bus line and the second source bus line.

According to another aspect of the disclosure, there is provided an active matrix substrate including:

a substrate having a plurality of pixel regions arranged in a row direction and a column direction in a matrix form;

a plurality of gate bus lines supported on the substrate and extending in the row direction; and a plurality of source bus lines supported on the substrate and extending in the column direction, wherein each of the pixel regions is defined by corresponding adjacent two of the gate bus lines and corresponding adjacent two of the source bus lines, wherein the each of the pixel regions includes a pixel electrode and an oxide semiconductor TFT including an oxide semiconductor layer serving as an active layer, the pixel electrode being electrically connected to a first one of the corresponding adjacent two of the source bus lines through the oxide semiconductor TFT, wherein the plurality of source bus lines include a first source bus line and a second source bus line that are adjacent to each other, wherein pixels sets each including two of the pixel regions whose pixel electrodes are electrically connected to the first source bus line and pixel sets each including two of the pixel regions whose pixel electrodes are electrically connected to the second source bus line are arranged alternately between the first source bus line and the second source bus line, wherein β(A−B) that is a β value of the each of the pixel regions is determined from formula (1) below using own source parasitic capacitance Csd(A) formed between the pixel electrode of the each of the pixel regions and the first one of the corresponding adjacent two of the source bus lines, other source parasitic capacitance Csd(B) formed between the pixel electrode and a second one of the corresponding adjacent two of the source bus lines, and pixel capacitance Cpi:

$$\beta(A-B) = \{Csd(A) - Csd(B)\}/Cpi, \text{ and} \qquad (1)$$

wherein each of the pixel sets are designed such that $$\beta_1(A-B) > 0,$$

$$\beta_2(A-B) < 0, \text{ and}$$

$$|\beta_1(A-B) + \beta_2(A-B)| \leq 0.001$$

are satisfied, where $\beta_1(A−B)$ and $\beta_2(A−B)$ are the β values of the respective two pixel regions in the each of the pixel sets.

BRIEF DESCRIPTION OF THE DRAWINGS

FIG. 4B is a cross-sectional view taken along line IVB-IVB in FIG. 4A;

FIG. 8 is a diagram showing a process flow explaining an example of a method for producing an active matrix substrate.

DESCRIPTION OF THE EMBODIMENTS

Figure 1:
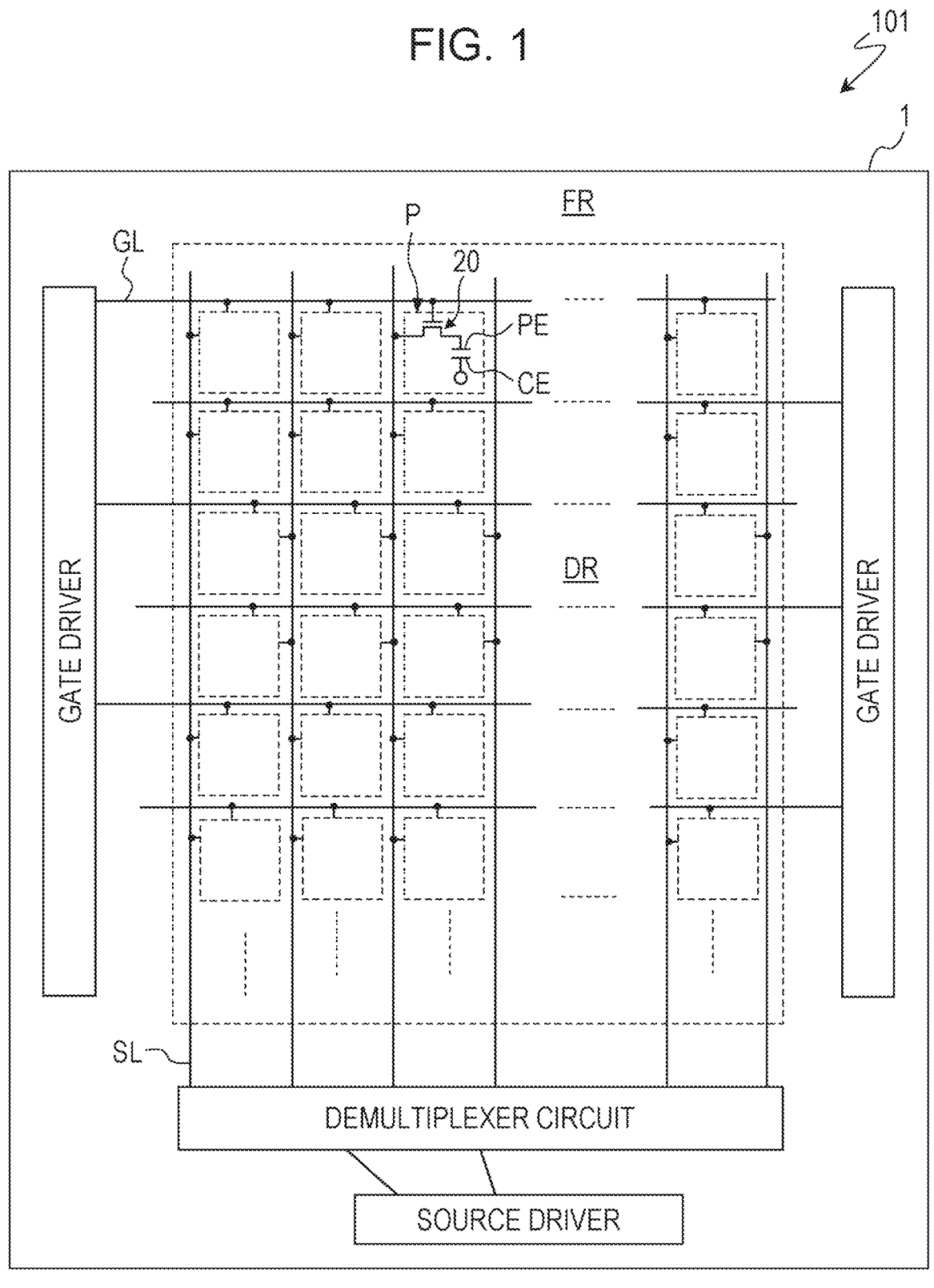
FIG. 1 is a schematic illustration showing an example of a plane structure of an active matrix substrate.

As described above, when low-frequency driving is performed on a liquid crystal display device, fluctuations in potentials of pixel electrodes (pixel potentials) may occur due to parasitic capacitance Csd when fluctuations in potentials of source bus lines occur during a pause period. This may cause changes in brightness of pixels, and a phenomenon called flicker may occur.

The parasitic capacitance Csd includes: parasitic capacitance Csd(A) formed between a pixel electrode of a pixel (a pixel of interest) and a source bus line that supplies a data signal to the pixel electrode (this source bus line is referred to as a "source bus line for the pixel of interest"); and parasitic capacitance Csd(B) formed between the pixel electrode of the pixel of interest and a source bus line that supplies a data signal to a pixel electrode adjacent to the above pixel electrode (this source bus line is referred to as another source bus line). In the present specification, the parasitic capacitance Csd(A) is referred to as "own source parasitic capacitance," and the parasitic capacitance Csd(B) is referred to as "other source parasitic capacitance."

The own source parasitic capacitance Csd(A) includes not only the parasitic capacitance formed between the pixel electrode of the pixel of interest and the source bus line for the pixel of interest that serve as capacitance electrodes (for example, normal parasitic capacitance described later) but also parasitic capacitance formed between the pixel electrode of the pixel of interest and a conductor (such as an electrode or a wiring line) electrically connected to the source bus line for the pixel of interest. Similarly, the other source parasitic capacitance Csd(B) also includes parasitic capacitance formed between the pixel electrode of the pixel of interest and a conductor (such as an electrode or a wiring line) electrically connected to another source bus line.

The change in the brightness of a pixel due to the parasitic capacitance Csd(the occurrence of flicker) can be reduced by reducing the absolute value of β(A−B) (hereinafter referred to as a "β value") represented by formula (1) below. For example, when the β value is substantially 0, the change in the brightness of the pixel due to the fluctuations in the potentials of the source bus lines can be minimized. Even when the low-frequency driving is not performed, a reduction in the display quality caused by the parasitic capacitance Csd can be avoided by reducing the β value.

$$\beta(A-B) = \{Csd(A) - Csd(B)\}/Cpi \qquad (1)$$

Csd(A): own source parasitic capacitance
Csd(B): other source parasitic capacitance
Cpi: pixel capacitance In the present specification, "Csd(A)/Cpi" of a pixel may be referred to as β(A) (hereinafter "own source β value"), and "Csd(B)/Cpi" of this pixel may be referred to as β(B) (hereinafter "other source β value"). β(A−B) is represented as the difference between the own source β value and the other source β value.

$$\beta(A-B) = \beta(A) - \beta(B) \qquad (2)$$

Figure 9:
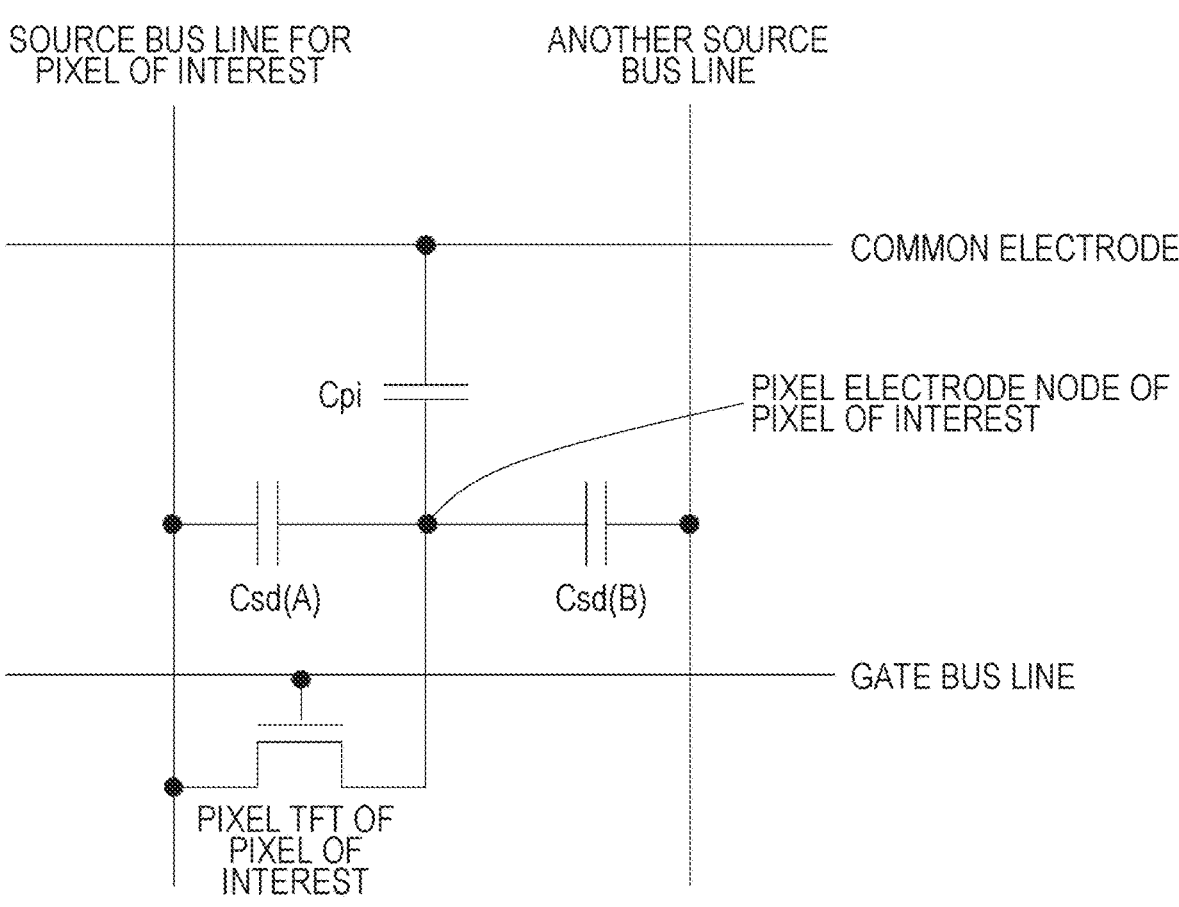
FIG. 9 is a circuit diagram showing parasitic capacitances Csd(A) and Csd(B) and pixel capacitance Cpi in a pixel region (a pixel of interest).

The pixel capacitance Cpi in formulas (1) and (2) includes liquid crystal capacitance formed between the pixel electrode of the pixel of interest and a common electrode and auxiliary capacitance. For example, in an active matrix substrate applied to a transverse electric field mode display device, the auxiliary capacitance includes, for example, transparent auxiliary capacitance formed between the pixel electrode of the pixel of interest and the common electrode. FIG. 9 shows the Csd(A), Csd(B), and Cpi in a pixel (a pixel of interest).

In one conventional technique used to prevent a reduction in display quality and the occurrence of flicker, the physical properties of the materials of components of the liquid crystal display device, processes, a driving method, etc. are controlled such that, for example, based on formula (1) above, the absolute value of the difference ΔCsd between the own source parasitic capacitance Csd(A) and the other source parasitic capacitance Csd(B) of each pixel is reduced (see, for example, Japanese Unexamined Patent Application Publication No. 2019-184725).

However, with the conventional technique proposed in Japanese Unexamined Patent Application Publication No. 2019-184725, the following problem may occur. There are a variety of needs for the performance of liquid crystal display devices in addition to the reduction in flicker, and it is therefore difficult to select the physical properties of materials, processes, and a driving method that allow the needs to be satisfied while a prescribed β value is maintained. Moreover, as the definition of a liquid crystal display device increases, the Cpi decreases, and the β value increases (see, formula (1) above). Therefore, when the definition of a liquid crystal display device is high, the occurrence of flicker may not be reduced sufficiently by controlling only the materials and the driving method.

The present inventors have contemplated that the layout of the pixels is utilized to control the β values of the pixels. However, when the layout of the pixels is designed with priority given to the reduction in the absolute value of ΔCsd of each pixel, the aperture ratio of each pixel decreases, and the efficiency of light utilization decreases, so that the desired display characteristics may not be obtained.

The present inventors have repeated studies, found a method that uses an approach different from conventional approaches and can reduce flicker caused by the parasitic capacitance Csd, and arrived at embodiments of the present disclosure. First and second approaches the inventors have found will next be described.

<First Approach>

It is generally known that the lower the parasitic capacitance Csd, the better. In contrast to the conventional knowledge, the present inventors have found that the balance between the own source parasitic capacitance Csd(A) of each pixel and its other source parasitic capacitance Csd(B) can be controlled by utilizing the layout of the oxide semiconductor layer of each pixel TFT to intentionally increase the own source or other source parasitic capacitance.

Generally, in an active matrix substrate of a liquid crystal display device, parasitic capacitances due to oblique electric fields may be formed between each pixel electrode and a source bus line for the pixel of interest that is located on one side of the pixel electrode and between the pixel electrode and another source bus line located on the other side (these parasitic capacitances are hereinafter referred to as "normal parasitic capacitances"). In some active matrix substrate structures, the normal parasitic capacitances can be very small (when, for example, the common electrode is present on the substrate side of the pixel electrodes).

In the first approach, an oxide semiconductor layer that is used as an active layer of each oxide semiconductor TFT is utilized to form further parasitic capacitances Cx, in addition to the normal parasitic capacitances. In the present specification, these parasitic capacitances Cx formed using the oxide semiconductor layer as capacitance electrodes are referred to as "additional parasitic capacitances" and distinguished from the parasitic capacitances (normal parasitic capacitances) caused by oblique electric fields and formed also in conventional structures. The additional parasitic capacitance Cx of a pixel of interest is an overlap capacitance that is formed, for example, by disposing the pixel electrode of the pixel of interest and the oxide semiconductor layer in the oxide semiconductor TFT of another pixel such that they partially overlap each other. By forming the additional parasitic capacitance Cx, the own source parasitic capacitance Csd(A) or the other source parasitic capacitance Csd(B) can be increased by a prescribed amount. This allows the balance between the own source parasitic capacitance Csd(A) and the other source parasitic capacitance Csd(B) to be controlled.

The additional parasitic capacitances Cx can be controlled by changing the layout of the pixels, irrespective of the materials and the driving method. Moreover, the additional parasitic capacitances Cx are formed from an oxide semiconductor film and a transparent conductive film and thus are transparent parasitic capacitances. Therefore, the formation of the additional parasitic capacitances Cx does not cause a reduction in the aperture ratio of the pixels.

<Second Approach>

As described above, in the conventional method, the absolute value of ΔCsd of each pixel is reduced to improve the β value in formula (1) above.

However, the present inventors have found that flicker due to the parasitic capacitance Csd can be reduced as follows. Two pixels adjacent to each other in the column direction and including pixel electrodes connected to the same source bus line are defined as one set (this set is hereinafter referred to as a "pixel set"). The flicker can be reduced by controlling the β value of each pixel set. This approach is suitably applicable to a display panel that performs a 2H-Z inversion_1S driving method described later. To control the parasitic capacitance of each pixel set, for example, the additional parasitic capacitances Cx described in the first approach may be used.

With the second approach, brightness changes in two pixels included in each pixel set can cancel each other out. In this manner, the change in brightness of the display region as a whole can be reduced, so that the occurrence of flicker can be reduced. Moreover, even when the absolute values of the β values of two pixels included in each pixel set PS are larger than a prescribed value, since it is only necessary that the absolute value of the β value of each pixel set be reduced, the design flexibility can be increased. Therefore, the display quality can be improved while a high pixel aperture ratio and high light utilization efficiency are maintained.

First Embodiment

Referring next to the drawings, an active matrix substrate in a first embodiment will be described. In the following description of the active matrix substrate, a region corresponding to a pixel of a display device is referred to as a "pixel region" or a "pixel."

<Basic Structure of Active Matrix Substrate>

FIG. 1 is a schematic illustration showing an example of a plane structure of an active matrix substrate 101. The active matrix substrate 101 has a display region DR that contributes to display and a peripheral region (frame region) FR located outside the display region DR. The display region DR includes a plurality of pixel regions P arranged in row and column directions in a matrix form. The pixel regions P (which may be referred to simply as "pixels") are regions corresponding to pixels of a display device. The non-display region FR is located on the periphery of the display region DR and does not contribute to display.

The active matrix substrate 101 includes, in the display region DR, a substrate 1, a plurality of TFTs (referred to also as "pixel TFTs") 20 supported on the substrate 1, a plurality of pixel electrodes PE, a plurality of gate bus lines GL that supply gate signals to the TFTs 20, and a plurality of source bus lines SL that supply source signals to the TFTs 20. Each of the pixel regions P is defined, for example, by two adjacent gate bus lines GL and two adjacent source bus lines SL. In the present specification, the direction in which the source bus lines SL extend is defined as a "column direction," and the direction in which the gate bus lines GL extend is defined as a "row direction." The row direction may be any direction that intersects the column direction and is not necessarily perpendicular to the column direction. In the present specification, a column including pixel regions P arranged in the column direction is referred to as a "pixel column," and a row including pixel regions P arranged in the row direction is referred to as a "pixel row."

Each of the TFTs 20 and each of the pixel electrodes PE are disposed so as to be associated with a corresponding one of the plurality of pixel regions P. The gate electrode of each TFT 20 is electrically connected to a corresponding one of the gate bus lines GL, and the source electrode of each TFT 20 is electrically connected to a corresponding one of the source bus lines SL. The drain electrode of each TFT 20 is electrically connected to the corresponding pixel electrode PE.

In the above example, the active matrix substrate 101 is configured such that the positional relation between pixel electrodes PE and a source bus line SL that supplies a data signal to these pixel electrodes PE is changed at two pixel row intervals. For example, the active matrix substrate 101 is applicable to a 2H-Z inversion driving type display device.

When the active matrix substrate 101 is applied to a transverse electric field mode display device such as an FFS (Fringe Field Switching) mode display device, an electrode (common electrode) CE common to the plurality of pixel regions P is disposed in the active matrix substrate 101.

Peripheral circuits such as drives may be disposed in the non-display region FR. For example, a gate driver GD that drives the gate bus lines GL and a demultiplexer circuit DMX that drives the source bus lines SL in a time-sharing manner may be formed monolithically.

A display device using the active matrix substrate 101 includes, for example, the active matrix substrate 101, a counter substrate, and a display medium layer disposed therebetween. The display medium layer may be a liquid crystal layer or an organic EL layer.

<Method for Driving Display Device Using Active Matrix Substrate>

In the display device using the active matrix substrate 101, progressive line scanning is performed. In the progressive line scanning method, data signals are supplied to the pixel electrodes PE. Specifically, when a TFT 20 selected by a control signal supplied to a gate bus line GL from the gate driver GD is turned on, a data signal is supplied to a source bus line SL connected to the selected TFT 20. Therefore, TFTs 20 connected to a specific gate bus line GL are turned on simultaneously, and then data signals are supplied from the source bus lines SL connected to the TFTs 20 in the pixel regions P in the selected row. This operation is sequentially repeated, for example, from the uppermost pixel row in the display surface to the lowermost pixel row, and one image (frame) is thereby written and displayed in the display region DR. The time from when one pixel row is selected to when the next row is selected is referred to as a horizontal scanning period (1H), and the time from when one row is selected to when the row is again selected is referred to as a vertical scanning period (1V) or a frame.

The display device is generally AC-driven. Typically, frame inversion driving is performed in which the polarity of the display signals is inverted every frame (every vertical scanning period). For example, the polarity is inverted every $\frac{1}{60}$ seconds (the cycle of polarity inversion is 30 Hz). To uniformly distribute pixels with voltages with different polarities applied thereto within one frame, column inversion (source line inversion) driving may be performed. The column inversion driving is a driving method in which the polarities of the pixel voltages are inverted every frame and every prescribed number (n) of source bus lines.

In the present embodiment, the following driving method, for example, is performed. Specifically, the active matrix substrate 101 used has a structure in which the positional relation between pixel electrodes PE and a source bus line SL corresponding to these pixel electrodes PE is changed at two pixel row intervals, and the polarity of the pixel voltage is inverted every frame and every source bus line SL (i.e., n=1). This driving method is referred to as a "2H-Z inversion_1S driving method." The 2H-Z inversion_1S driving method is disclosed in, for example, Japanese Unexamined Patent Application Publication No. 2009-44438. The entire contents of the disclosure of Japanese Unexamined Patent Application Publication No. 2009-44438 are incorporated by reference for reference purposes.

<Structure of Pixel Regions of Active Matrix Substrate>

The structure of the pixel regions of the active matrix substrate 101 in the present embodiment will be described using an active matrix substrate applied to an FFS mode display device as an example.

Figure 2A:
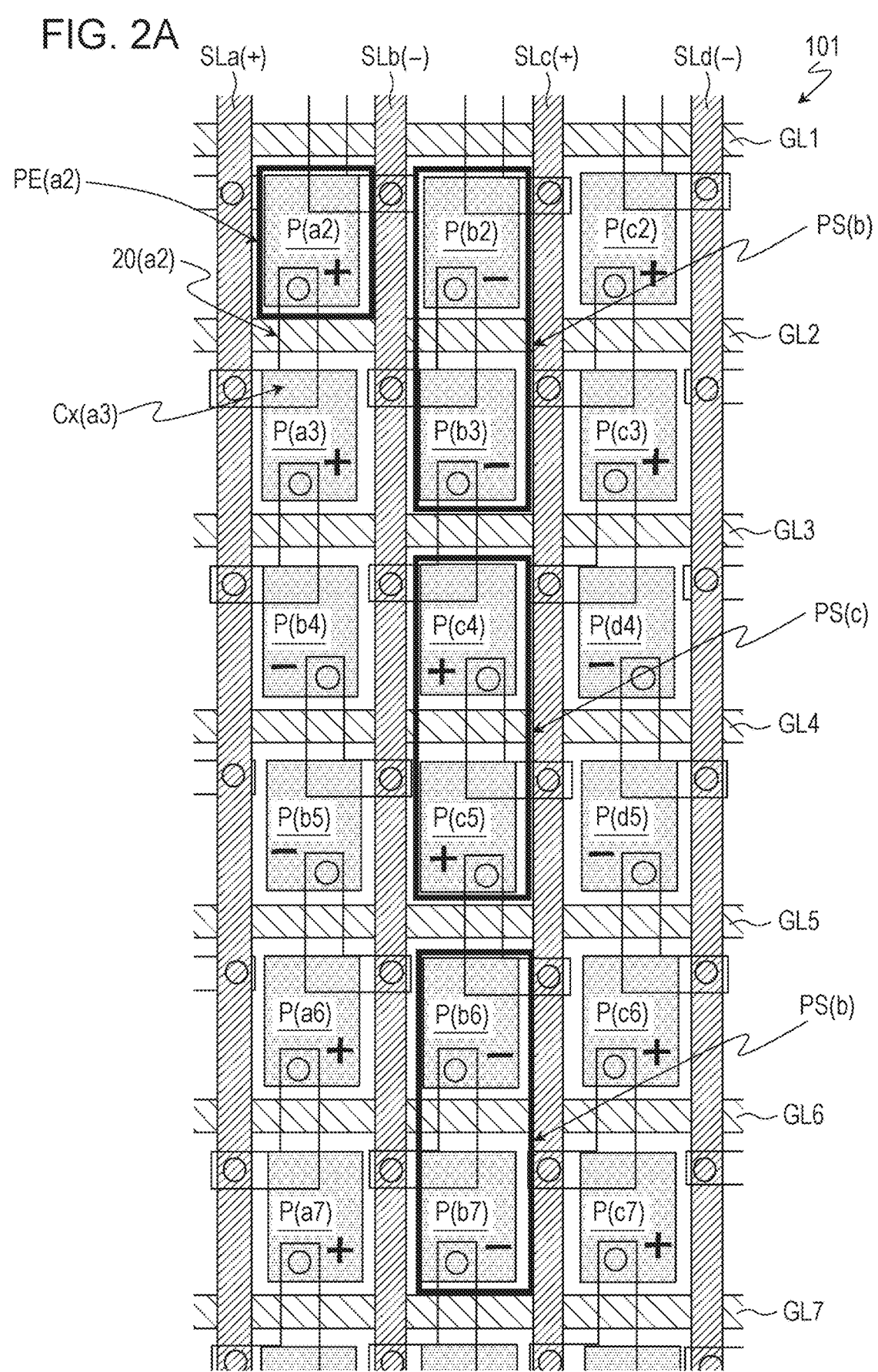
FIG. 2A is a plan view showing some pixel regions in the active matrix substrate.
Figure 2B:
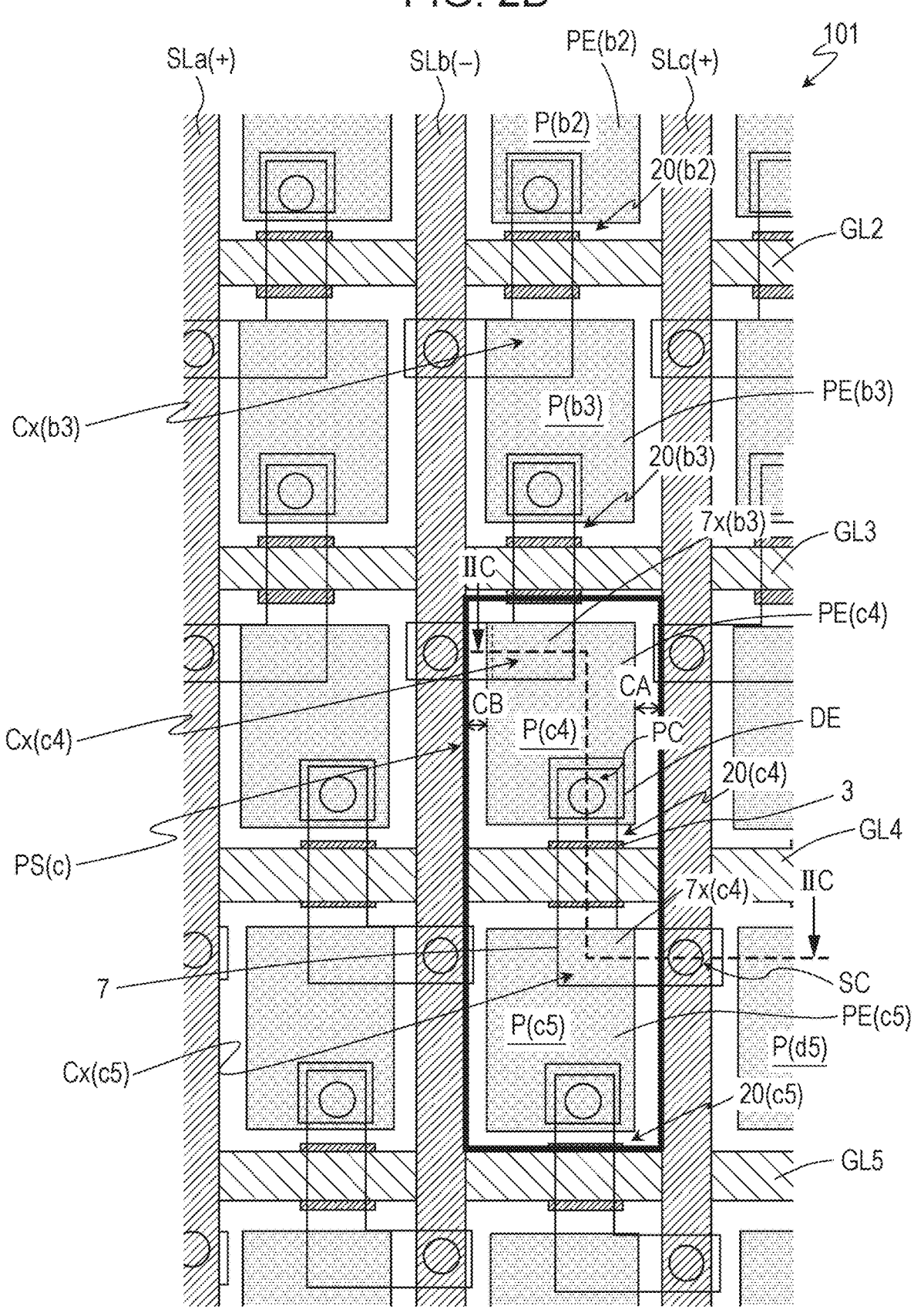
FIG. 2B is an enlarged plan view showing some pixel regions in the active matrix substrate.
Figure 2C:
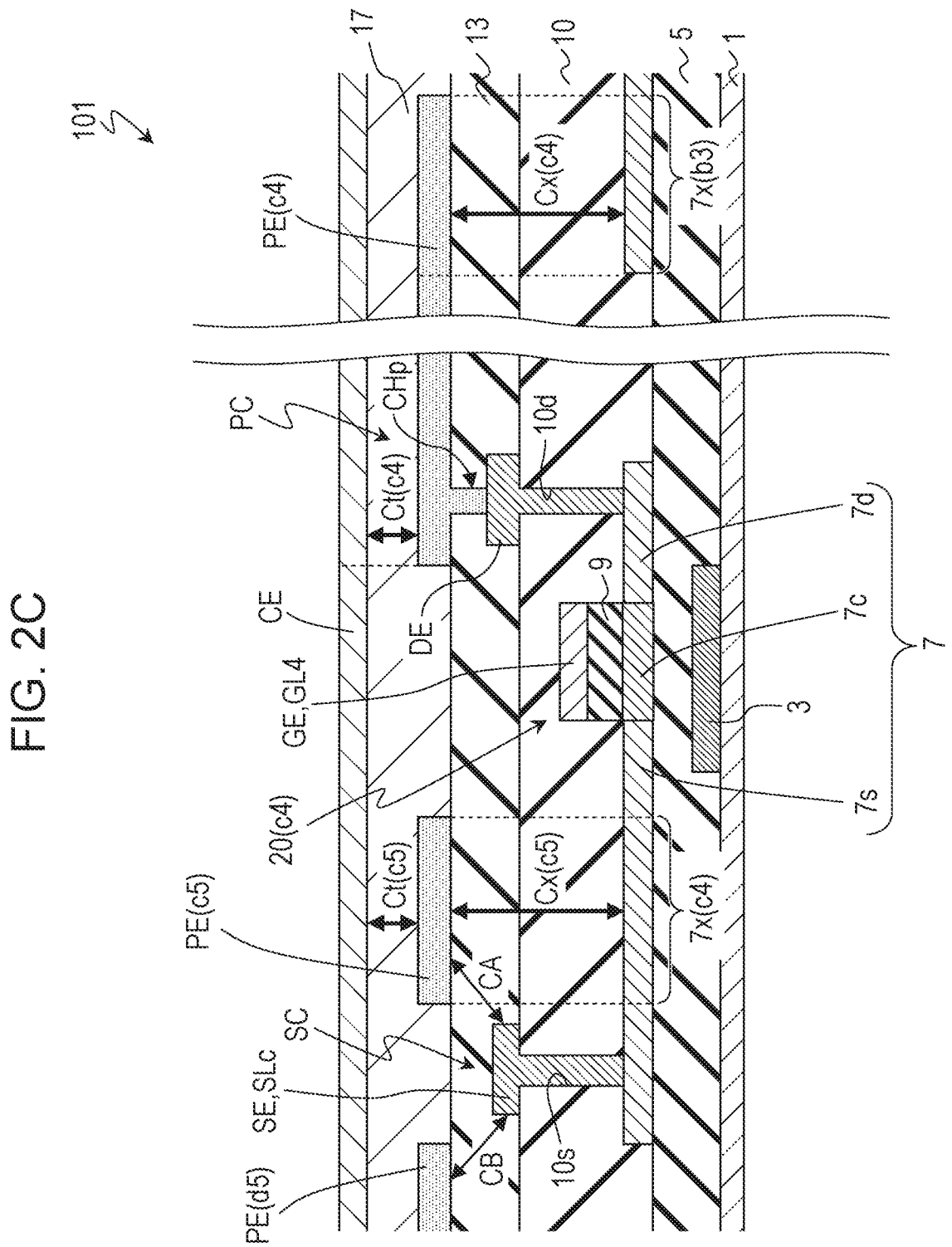
FIG. 2C is a cross-sectional view taken along line IIC-IIC in FIG. 2B.

FIG. 2A is a plan view exemplifying a plurality of pixel regions P in the active matrix substrate 101. FIG. 2B is an enlarged plan view of some of the pixel regions shown in FIG. 2A. FIG. 2C is a cross-sectional view taken along line IIC-IIC in FIG. 2B.

The active matrix substrate 101 includes the substrate 1 and further includes the plurality of source bus lines SL and the plurality of gate bus lines GL that are supported on the substrate 1. Among the plurality of gate bus lines GL, seven gate bus lines GL1 to GL7 arranged in this order from the upper side of the figure are shown in FIG. 2A. Among the plurality of source bus lines SL, source bus lines SLa to SLd arranged in this order from the left side of the figure are shown in FIG. 2A. Moreover, a plurality of pixel regions P(kj) (18 pixel regions in the figure) defined by these bus lines are also shown. In the present specification, a pixel region associated with a source bus lines SLk (k is one of a to d in this figure) and a gate bus line GLj (j is one of 1 to 7 in this figure) is denoted as a "pixel region P(kj)." The pixel electrode PE and TFT 20 of the pixel region P(kj) may be denoted as a "pixel electrode PE(kj)" and a "TFT 20 (*kj*)," respectively. For example, a pixel region P(a2) is associated with the gate bus line GL2 and the source bus line SLa. A gate signal is supplied to the TFT 20 (*a2*) of the pixel region P(a2) from the gate bus line GL2, and a data signal is supplied to the TFT 20 (*a2*) from the source bus line SLa.

In the display device using the active matrix substrate 101, for example, first polarity source bus lines to which first data signals with first polarity are supplied and second polarity source bus lines to which second data signals with second polarity opposite to the first polarity are arranged alternately. The polarity of the first data signals and the polarity of the second data signals are inverted every frame. However, in FIG. 2A, the first polarity is denoted as (+), and the second polarity is denoted as (−), for the sake of convenience. In this case, the source bus lines SLa and SLc are first polarity source bus lines, and the source bus line SLb and SLd are second polarity source bus lines.

Each pixel region P includes the corresponding pixel electrode PE and the corresponding TFT 20. Each pixel electrode PE is electrically connected to one of the source bus lines SL disposed on the opposite sides of the pixel electrode PE through the corresponding TFT 20.

In the present embodiment, the pixel electrode PE of each pixel region P is connected to a source bus line SL different from source bus lines SL to which the pixel electrodes PE of pixel regions P adjacent to the each pixel region P in the row direction are connected. In each pixel column, the source bus line SL to which pixel electrodes PE are connected is changed every two pixel rows. Specifically, in each pixel column, pairs of pixel electrodes PE connected to a source bus line SL located on the right side and pairs of pixel electrodes PE connected to a source bus line SL located on the left side are arranged alternately. In the present specification, a set including two pixel regions which are adjacent to each other in the column direction and whose pixel electrodes are electrically connected to the same source bus line SL is referred to as a "pixel set PS."

For example, in a pixel column located between the source bus line SLb and the source bus line SLc adjacent to each other, pixel sets PS(b) each including two pixel regions whose pixel electrodes PE are connected to the source bus line SLb and pixel sets PS(c) each including two pixel regions whose pixel electrodes PE are connected to the source bus line SLc are arranged alternately. A data signal with the second polarity is supplied from the source bus line SLb to the pixel electrodes PE in the pixel sets PS(b). A data signal with the first polarity is supplied from the source bus line SLc to the pixel electrodes PE in the pixel sets PS(c).

In the present embodiment, the pixel electrode PE of each pixel region partially overlaps an oxide semiconductor layer 7 in the TFT 20 of another pixel region with an insulating layer therebetween and therefore has an additional parasitic capacitance (source-drain capacitance) Cx. For example, the pixel region P(a3) has an additional parasitic capacitance Cx(a3) formed in an overlapping portion of the pixel electrode PE(a3) of the pixel of interest that partially overlaps the oxide semiconductor layer 7 in the TFT 20 (a2) of the pixel region P(a2) adjacent to the pixel of interest in the column direction.

Referring next to FIGS. 2B and 2C, the structure of the pixel regions P in the present embodiment will be described in more detail using the pixel region P(c4) as an example.

As shown in FIG. 2C, each TFT 20 includes the oxide semiconductor layer 7 and a gate electrode GE disposed on part of the oxide semiconductor layer 7 with a gate insulating layer 9 interposed therebetween. The TFT 20 may further include a source electrode SE and a drain electrode DE. In this example, the oxide semiconductor layer 7 is located between the gate electrode GE and the substrate 1. Specifically, the TFT 20 is a top gate-type TFT.

The oxide semiconductor layer 7 includes a channel region 7c and further includes a first region 7s and a second region 7d disposed on opposite sides of the channel region 7c. The first region 7s and the second region 7d are low-resistance regions having a smaller specific resistance than the channel region 7c. The first region 7s is electrically connected to the corresponding source bus line SL, and the second region 7d is electrically connected to the corresponding pixel electrode PE. In the pixel region P(c4), the first region 7s of the TFT 20(c4) is electrically connected to the source bus line SLc, and the second region 7d is electrically connected to the pixel electrode PE(c4). The first region 7s may be electrically connected to the source bus line SLc through the source electrode SE. The second region 7d may be electrically connected to the pixel electrode PE(c4) through the drain electrode DE.

The gate electrode GE is disposed so as to overlap the channel region 7c when viewed in the direction normal to the principal surface of the substrate 1 (hereinafter abbreviated as the "direction normal to the substrate 1"). The gate electrode GE is formed using the same conductive film (gate conductive film) as that for the gate bus lines GL. In the present specification, a layer including electrodes and wiring lines formed from the gate conductive film is referred to as a "gate metal layer." The gate electrode GE is electrically connected to the corresponding gate bus line GL. The gate electrode GE may be formed integrally with the corresponding gate bus line GL. For example, the gate electrode GE may be part of the corresponding gate bus line GL. In this case, part of the gate bus line GL that overlaps the oxide semiconductor layer 7 when the gate bus line GL is viewed in the direction normal to the substrate 1 is referred to as the "gate electrode GE." When viewed in the direction normal to the substrate 1, the gate electrode GE overlaps the channel region 7c but may be disposed so as not to overlap the low-resistance regions (the first region 7s and the second region 7d).

The gate insulating layer 9 may cover the channel region 7c and may not cover the first region 7s and the second region 7d. The above structure can be obtained by subjecting portions of the oxide semiconductor layer 7 that are not covered with the gate insulating layer 9 to resistance reduction. In the example illustrated, the gate insulating layer 9 is formed only in a region that overlaps the gate metal layer when viewed in the direction normal to the substrate 1. Specifically, the edges of the gate insulating layer 9 match the edges of the gate metal layer. This structure can be obtained by patterning the gate insulating layer using the same resist mask as that used to pattern the gate metal layer or using the gate electrode GE as a mask.

In the present embodiment, the oxide semiconductor layer 7, the gate insulating layer 9, and the gate metal layer are covered with an interlayer insulating layer 10, and the source electrode SE and the drain electrode DE are disposed on the interlayer insulating layer 10. The interlayer insulating layer 10 may be in contact with the first region 7s and the second region 7d of the oxide semiconductor layer 7. A first opening 10s through which part of the first region 7s of the oxide semiconductor layer 7 is exposed and a second opening 10d through which part of the second region 7d is exposed are provided in the interlayer insulating layer 10. The source electrode SE is disposed on the interlayer insulating layer 10 and in the first opening 10s and connected to the first region 7s within the first opening 10s. The drain electrode DE is disposed on the interlayer insulating layer 10 and in the second opening 10d and connected to the second region 7d within the second opening 10d.

The source electrode SE and the drain electrode DE may be formed using the same conductive film (source conductive film) as that used for the source bus lines SL. In the present specification, a layer including electrodes and wiring lines formed using the source conductive film is referred to as a "source metal layer." The source electrode SE is electrically connected to the corresponding source bus line SLc. The source electrode SE may be formed integrally with the corresponding source bus line SL. For example, the source electrode SE may be part of the corresponding source bus line SL. In this case, part of the source bus line SL that is in contact with the first region $7s$ is referred to as the "source electrode SE." In the present specification, the connection portion SC between the first region $7s$ of the oxide semiconductor layer 7 and the source bus line SL may be referred to as a "source contact portion." In the example illustrated, the source contact portion SC is disposed so as to overlap the source bus line SL.

The drain electrode DE is electrically connected to the corresponding pixel electrode PE(the pixel electrode (c4) is this case). In the present specification, the connection portion PC between the second region $7d$ of the TFT 20 and the pixel electrode PE may be referred to as a "pixel contact portion." The pixel contact portion PC is disposed, for example, inside the pixel region P. The drain electrode DE may not be disposed in the source metal layer, and the pixel electrode PE may be brought into direct contact with part of the second region $7d$ in the oxide semiconductor layer 7 within the pixel contact portion PC.

The TFT 20 may include a conductive layer 3 located between the oxide semiconductor layer 7 and the substrate 1. The conductive layer 3 may be covered with a lower insulating layer 5, and the oxide semiconductor layer 7 may be disposed on the lower insulating layer 5. When viewed in the direction normal to the substrate 1, the conductive layer 3 may be disposed so as to overlap at least the channel region $7c$ of the oxide semiconductor layer 7. In this case, deterioration of the characteristics of the oxide semiconductor layer 7 due to light from the substrate 1 side (light from a backlight) can be reduced. The conductive layer 3 may be in an electrically floating state or may be fixed to, for example, the GND potential (0 V). Alternatively, the conductive layer 3 may be electrically connected to the gate electrode GE through an unillustrated connection portion so as to function as a lower gate electrode.

An upper insulating layer 13 is disposed on the source metal layer. The upper insulating layer 13 includes, for example, an inorganic insulating layer (passivation film). The upper insulating layer 13 may have a layered structure including the inorganic insulating layer and an organic insulating layer formed on the inorganic insulating layer. The organic insulating layer may not be formed. Alternatively, the organic insulating layer may be formed only in the display region.

The pixel electrode PE is disposed on the upper insulating layer 13. The pixel electrode PE is isolated from adjacent pixel electrodes PE. The pixel electrode PE is electrically connected to the drain electrode DE of the TFT 20 within a pixel contact hole CHp formed in the upper insulating layer 13.

The common electrode CE is disposed on the pixel electrode PE with a dielectric layer 17 interposed therebetween. Although not illustrated, one or a plurality of slits (openings) or cutout portions are provided in the common electrode CE at positions within each of the pixel regions P. The common electrode CE may not be separated for each of the pixel regions P. As shown in FIG. 2C, the common electrode CE partially overlaps each pixel electrode PE(the pixel electrodes PE(c4) and PE(c5) in FIG. 2C) with the dielectric layer 17 interposed therebetween, and auxiliary capacitances Ct (auxiliary capacitances Ct(c4) and Ct(c5) in FIG. 2C) are thereby formed. The auxiliary capacitances Ct are formed from transparent materials and referred to also as transparent auxiliary capacitances. When the transparent auxiliary capacitances are formed, the pixel capacitance Cpi increases, so that the β value can be reduced.

<Structure of Additional Parasitic Capacitances Cx>

The structure of the additional parasitic capacitances Cx in the present embodiment will be described.

In each pixel column in the present specification, a pixel region that is adjacent to one pixel region P (pixel of interest) with a gate bus line GL interposed therebetween is referred to as a "first adjacent pixel region." A pixel region that is adjacent to the one pixel region P (pixel of interest) on the side opposite to the first adjacent pixel region with another gate bus line GL interposed therebetween is referred to as a "second adjacent pixel region." The pixel of interest in the pixel column in this case is one of the pixel regions except for the two pixel regions at opposite ends.

When viewed in the direction normal to the substrate 1, the first region $7s$ in the oxide semiconductor layer 7 in the TFT 20 of each pixel region P extends across the corresponding gate bus line GL, reaches the first adjacent pixel region, and partially overlaps the pixel electrode PE of the first adjacent pixel region. In the first region $7s$, a portion $7x$ partially overlapping the pixel electrode PE of the first adjacent pixel region is referred to as an "overlapping portion." An additional parasitic capacitance Cx is formed by the overlapping portion $7x$, the pixel electrode PE of the first adjacent pixel region, and insulating layers located therebetween (the interlayer insulating layer 10 and the upper insulating layer 13 in this case). Specifically, the overlapping portion $7x$ in the oxide semiconductor layer 7 functions as a transparent capacitance electrode forming the parasitic capacitance. The overlapping portion $7x$ in the oxide semiconductor layer 7 may be located between the channel region $7c$ and the source contact portion SC in a channel length direction.

In the example illustrated, when viewed in the direction normal to the substrate 1, the first region $7s$ in the oxide semiconductor layer 7 in the TFT 20(c4) of the pixel region P(c4) includes the overlapping portion $7x$(c4) that partially overlaps a pixel electrode PE(c5) of a pixel region (first adjacent pixel region) P(c5) adjacent to the pixel region P(c4) in the column direction with the gate bus line GL4 interposed therebetween. The overlapping portion $7x$(c4) in the oxide semiconductor layer 7, the pixel electrode PE(c5), and the insulating layers located therebetween form an additional parasitic capacitance Cx(c5).

When viewed in the direction normal to the substrate 1, the pixel electrode PE(c4) of the pixel region P(c4) overlaps an overlapping portion $7x$(b3) of a TFT 20(b3) of a pixel region (second adjacent pixel region) P(b3) adjacent to the pixel region P(c4) with the gate bus line GL3 interposed therebetween. The overlapping portion $7x$(b3), the pixel electrode PE(c4), and the insulating layers located therebetween form an additional parasitic capacitance Cx(c4).

<Parasitic Capacitances Csd and β Values of Pixels and Pixel Sets PS>

The additional parasitic capacitance Cx of each pixel region is added to one of the own source parasitic capacitance Csd(A) and the other source parasitic capacitance Csd(B).

For a pixel region (pixel of interest) P, when the oxide semiconductor layer 7 in the second adjacent pixel region is electrically connected to the source bus line for the pixel of interest, the additional parasitic capacitance Cx is added to the own source parasitic capacitance Csd(A). When the oxide semiconductor layer in the second adjacent pixel region is electrically connected to another source bus line, the additional parasitic capacitances Cx is added to the other source parasitic capacitance Csd(B). In the present specification, the additional parasitic capacitance Cx formed between the pixel of interest and the source bus line for the pixel of interest is referred to as an "additional own source parasitic capacitance Cx(A)," and the additional parasitic capacitance Cx formed between the pixel of interest and another source bus line is referred to as an "additional other source parasitic capacitance Cx(B)."

In the present embodiment, one of the two pixel regions forming a pixel set PS has the additional own source parasitic capacitance Cx(A), and the other has the additional other source parasitic capacitance Cx(B). Therefore, in each pixel set PS, the changes in the β values of the two pixel regions due to the additional parasitic capacitances Cx(i.e., changes in brightness) can cancel each other out.

In the present specification, one of the two pixel regions in a pixel set PS that has the additional own source parasitic capacitance Cx(A) is referred to as a "first pixel region," and the other one having the additional other source parasitic capacitance Cx(B) is referred to as a "second pixel region."

The direction of the change in brightness due to the change in the polarity of the data signal in the first pixel region may be opposite to that in the second pixel region. Specifically, $\beta_1(A-B)$ that is the β value of the first pixel region may be positive, and $\beta_2(A-B)$ that is the β value of the second pixel region may be negative. In this case, the changes in the brightness in the two pixel regions cancel each other out, so that the occurrence of flicker can be more effectively reduced.

The β value of each pixel set PS will be described in more detail using a pixel set PS(c) including the pixel region P(c4) and the pixel region P(c5) as an example.

In the pixel region P(c4), the pixel electrode PE(c4) forms a normal parasitic capacitance CA due to an oblique electric field between the pixel electrode PE(c4) and the source bus line SLc, which is the source bus line for the pixel of interest, and forms a normal parasitic capacitance CB due to an oblique electric field between the pixel electrode PE(c4) and the source bus line SLb, which is another source bus line, (see FIG. 2B). Moreover, the pixel electrode PE(c4) forms an additional parasitic capacitance Cx(c4) between the pixel electrode PE(c4) and the overlapping portion 7x(b3) in the oxide semiconductor layer 7 in the TFT 20(b3) of the pixel region P(b3), which is the second adjacent pixel region (see FIGS. 2B and 2C). The additional parasitic capacitance Cx(c4) may be larger than the normal parasitic capacitances CA and CB. Since the overlapping portion 7x(b3) is connected to the source bus line SLb serving as another source bus line, the additional parasitic capacitance Cx(c4) is the other source parasitic capacitance. Therefore, the formation of the additional parasitic capacitance Cx(c4) increases the other source parasitic capacitance $Csd_{c4}(B)$ of the pixel region P(c4). In the pixel region P(c4), the other source parasitic capacitance $Csd_{c4}(B)$ may be larger than the own source parasitic capacitance $Csd_{c4}(A)$. In this case, the other source β value $\beta_{c4}(B)$ of the pixel region P(c4) is larger than the own source β value $\beta_{c4}(A)$. Specifically, the β value is negative.

$$\Delta Csd_{c4} = Csd_{c4}(A) - Csd_{c4}(B) < 0$$

$Csd_{c4}(A)$: This includes the normal parasitic capacitance CA.

$Csd_{c4}(B)$: This includes the normal parasitic capacitance CB and the additional other source parasitic capacitance Cx(c4).

$$\beta_{c4}(A-B) = Csd_{c4}(A)/Cpi_{c4} - Csd_{c4}(B)/Cpi_{c4} = \beta_{c4}(A) - \beta_{c4}(B) < 0$$

The pixel region P(c5) has an additional parasitic capacitance Cx(c5) in addition to the normal parasitic capacitances CA and CB due to oblique electric fields. The additional parasitic capacitance Cx(c5) is formed by the overlap between the pixel electrode PE(c5) and the overlapping portion 7x(c4) in the oxide semiconductor layer 7 in the TFT 20(c4) of the pixel region P(c4). Since the overlapping portion 7x(c4) is connected to the source bus line SLc serving as the source bus line for the pixel of interest, the additional parasitic capacitance Cx(c5) is the own source parasitic capacitance. Therefore, the formation of the additional parasitic capacitance Cx(c5) increases the own source parasitic capacitance $Csd_{c5}(A)$ of the pixel region P(c5). In the pixel region P(c5), the own source parasitic capacitance $Csd_{c5}(A)$ may be larger than the other source parasitic capacitance $Csd_{c5}(B)$. In this case, the own source β value $\beta_{c5}(A)$ of the pixel region P(c5) is larger than the other source β value $\beta_{c5}(B)$. Specifically, the β value is positive.

$$\Delta Csd_{c5} = Csd_{c5}(A) - Csd_{c5}(B) > 0$$

$Csd_{c5}(A)$: This includes the normal parasitic capacitance CA and the additional other source parasitic capacitance Cx(c5).

$Csd_{c5}(B)$: This includes the normal parasitic capacitance CB.

$$\beta_{c5}(A-B) = Csd_{c5}(A)/Cpi_{c5} - Csd_{c5}(B)/Cpi_{c5} = \beta_{c5}(A) - \beta_{c5}(B) > 0$$

In this pixel set PS(c), part or all of the increase in the other source β value due to the additional parasitic capacitance Cx(c4) of the pixel region P(c4) may be cancelled out by the increase in the own source β value due to the additional parasitic capacitance Cx(c5) of the pixel region P(c5). Therefore, the absolute value of the β value ($\beta_{PS}(A-B)$) of the pixel set can be reduced. The absolute value of $\beta_{PS}(A-B)$ may be, for example, 0.001 or less.

$$\beta_{PS}(A-B) = \beta_{c4}(A-B) + \beta_{c5}(A-B)$$

$$|\beta_{PS}(A-B)| \leq 0.001$$

In the above example, $\beta_{c4}(A-B)$ is negative, and $\beta_{c5}(A-B)$ is positive. When one of the β values of the two pixel regions forming the pixel set is positive and the other one is negative as described above, the absolute value of the β value of the pixel set can be smaller than the absolute values of the β values of the pixel regions.

$$|\beta_{PS}(A-B)| < |\beta_{c4}(A-B)|$$

$$|\beta_{PS}(A-B)| < |\beta_{c5}(A-B)|$$

The absolute values of the β values of the pixel regions may be, for example, 0.001 or more.

As described above, in the present embodiment, by reducing the absolute value of the β value of the pixel set PS, the occurrence of flicker due to the parasitic capacitance Csd can be reduced. Since it is unnecessary to reduce the capacitance difference ΔCsd for each pixel region P, the design flexibility is high. For example, as shown in FIGS. 2A to 2C, the pixel regions are arranged such that each pixel electrode and the semiconductor layer in the TFT of an adjacent pixel region partially overlap each other in plan view. This allows the occurrence of flicker due to the parasitic capacitance Csd to be reduced while a high pixel aperture ratio is maintained.

The additional parasitic capacitances Cx in the present embodiment are transparent parasitic capacitances formed by the pixel electrodes PE formed from a transparent conductive film and the oxide semiconductor layer 7 that is a transparent oxide semiconductor film as capacitance electrodes. Therefore, even when the additional parasitic capacitances Cx are formed, no reduction in light transmittance occurs. In the case where silicon TFTs are used as the pixel TFTs, when a silicon semiconductor film is used to form parasitic capacitances, loss of light transmittance may occur.

The additional parasitic capacitance Cx of each pixel region P can be easily controlled, for example, by changing the overlapping area between the pixel electrode PE and the oxide semiconductor layer 7 in the TFT 20 of the second adjacent pixel region. Therefore, by adjusting the additional parasitic capacitances Cx(overlapping areas) of the two pixel regions in each pixel set, the β value of the pixel set PS can be controlled.

In each pixel set PS, the magnitude of the additional own source parasitic capacitance Cx(A) formed in the first pixel region may be substantially the same as the magnitude of the additional other source parasitic capacitance Cx(B) formed in the second pixel region. Alternatively, the magnitude of the additional own source parasitic capacitance Cx(A) and the magnitude of the additional other source parasitic capacitance Cx(B) may differ from each other, with consideration given to the differences from other parasitic capacitances such as the normal parasitic capacitances of the two pixel regions. For example, when the normal parasitic capacitance CA (PS) of a pixel set PS is larger than its normal parasitic capacitance CB (PS) due to the influence of the layout of bus lines, touch wiring lines, etc., the pixel set PS may be designed such that the additional own source parasitic capacitance Cx(A) is smaller than the additional other source parasitic capacitance Cx(B).

No particular limitation is imposed on the areas for the additional parasitic capacitances Cx. The areas may each be from 0.1% to 10% inclusive of the area of the pixel electrodes PE. The area of the pixel electrodes PE may be, for example, several hundreds of μm² to several thousands of μm². No particular limitation is imposed on the line width of the oxide semiconductor layer 7 (the width of the low-resistance regions), and the width may be, for example, about 3 μm.

In each pixel region P, the additional parasitic capacitance Cx may be larger than the normal parasitic capacitances CA and CB. In this case, by controlling the additional parasitic capacitances Cx, the β value of each pixel set PS can be controlled more effectively.

The layout of the pixel regions P is not limited to the illustrated example. It is only necessary that the TFTs 20 and the pixel electrodes PE be disposed such that the oxide semiconductor layer 7 in the TFT 20 of each pixel region P has a portion overlapping the pixel electrode PE of another pixel region P when viewed in the direction normal to the substrate 1. In the example illustrated, the oxide semiconductor layer 7 has an L shape including a portion extending in the column direction and a portion extending in the row direction when viewed in the direction normal to the substrate 1, but the plane shape of the oxide semiconductor layer 7 is not limited to the above shape. For example, the oxide semiconductor layer 7 may include a portion extending in an oblique direction (a direction intersecting the column direction and the row direction) or may include a portion extending along a source bus line SL in an overlapping manner.

No particular limitation is imposed on the structure of the TFTs 20 disposed in the pixel regions P. In the above example, each of the TFTs 20 is a top gate-type TFT but may be a bottom gate-type TFT having a gate electrode disposed between the oxide semiconductor layer and the substrate. However, the top gate-type TFT is suitable because a region of the oxide semiconductor layer 7 that is other than the channel region 7c can be easily reduced in resistance and can be used as a transparent capacitance electrode.

In the present embodiment, the common electrode CE may be disposed on the pixel electrodes PE. When the common electrode CE is disposed on the pixel electrodes PE, transparent capacitance electrodes can be easily formed by overlapping portions of the TFTs 20, the oxide semiconductor layer 7, and the pixel electrodes PE. When the common electrode CE is disposed on the pixel electrodes PE, the normal parasitic capacitances CA and CB formed between the pixel electrodes PE and the source bus lines SL are larger than those when the common electrode CE is disposed on the substrate 1 side of the pixel electrodes PE. Therefore, the formation of the additional parasitic capacitances Cx allows the occurrence of flicker to be reduced more effectively. The active matrix substrate may not include the common electrode CE. Such an active matrix substrate is applicable to a vertical electric field mode display device. In the vertical electric field mode display device, the common electrode CE is disposed on the counter substrate side.

<Design Examples of β Values>

Examples of the design ranges of the β values of the pixel sets are shown in Table 1. Table 1 also shows examples of the β values of a display panel designed using a conventional method as a Reference Example.

The Reference Example is designed such that the absolute values of the β values of the pixel regions are 0.001 or less. However, the Example is designed such that the absolute values of the β values of the pixel sets are 0.001 or less. In the Example, it is only necessary that the β value of each first pixel region be positive and that the β value of each second pixel region be negative. The first and second pixel regions may be designed such that the absolute values of their β values are larger than 0.001 and 0.004 or less. When the absolute values are 0.004 or less, the change in brightness of each pixel region can be reduced. When the absolute values are larger than 0.001, the brightness changes in the first and second pixel regions cancel each other out, and a better effect can be obtained.

TABLE 1

|  | Reference Example | Example |
|---|---|---|
| β value of first pixel regions | $-0.001 \leq \beta_1(A - B) \leq 0.001$ | $\beta_1(A - B) > 0$ For example, $0.001 \leq \beta_1(A - B) \leq 0.004$ |
| β value of second pixel regions | $-0.001 \leq \beta_2(A - B) \leq 0.001$ | $\beta_2(A - B) < 0$ For example, $-0.004 \leq \beta_2(A - B) \leq -0.001$ |
| β value of pixel sets (absolute value) | — | $\|\beta_1(A - B) + \beta_2(A - B)\| \leq 0.001$ |

<Display Device>

Figure 3:
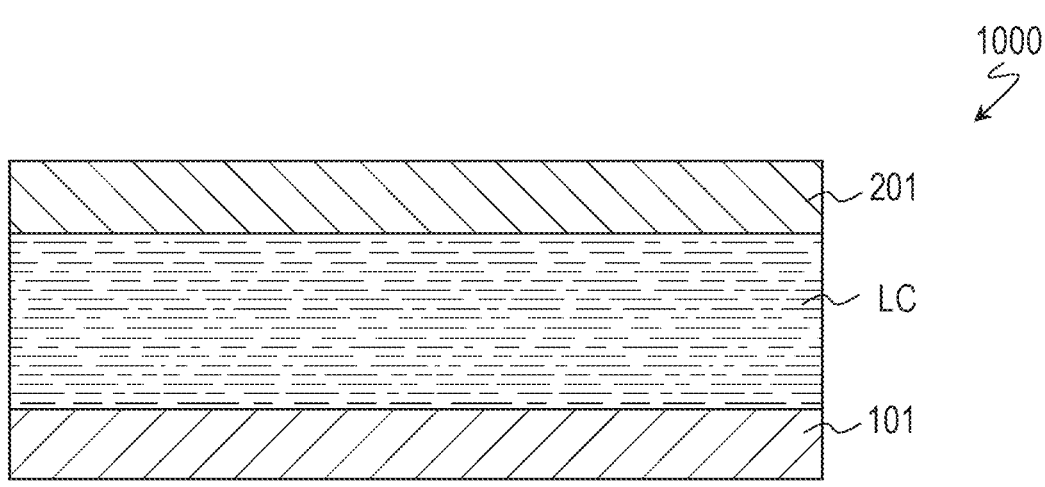
FIG. 3 is a cross-sectional view of a liquid crystal display device that uses the active matrix substrate.

The active matrix substrate 101 in the present embodiment is applicable to, for example, a liquid crystal display device. FIG. 3 is a schematic cross-sectional view of a liquid crystal display device 1000 that uses the active matrix substrate 101. The liquid crystal display device 1000 includes the active matrix substrate 101, a counter substrate 201 disposed so as to be opposed to the active matrix substrate 101, and a liquid crystal layer LC disposed between the active matrix substrate 101 and the counter substrate 201.

The present embodiment is suitably used for a 2H-Z inversion_1S driving-type display device. In the 2H-Z inversion_1S driving method, the additional parasitic capacitances Cx easily allow the directions of changes in brightness (the signs of the β values) in the two pixel regions forming each pixel set to differ from each other.

The active matrix substrate 101 in the present embodiment is particularly suitably applicable to, for example, a display device that performs low-frequency driving (e.g., 60 Hz or less). When the low-frequency driving is performed, flicker tends to occur due to a change in the brightness of pixels during a pause period. Therefore, the effect of reducing flicker that is obtained by the formation of the additional parasitic capacitances Cx can be more remarkable.

The present embodiment is also applicable to a display device that does not perform low-frequency driving. With the present embodiment, fluctuations in pixel potential due to parasitic capacitance can be reduced. Therefore, even when the low-frequency driving is not performed, the occurrence of flicker and a reduction in display quality due to fluctuations in pixel potential can be avoided. A suitable range of the β value ($\beta_{PS}(A–B)$) of each pixel set may vary depending on the driving frequency. For example, the lower the driving frequency, the smaller the absolute value of $\beta_{PS}(A–B)$ needs to be (the closer the absolute value of the $\beta_{PS}(A–B)$ needs to be to 0). In the present embodiment, the magnitudes of the additional parasitic capacitances Cx of the two pixel regions of each pixel set may be adjusted such that the $\beta_{PS}(A–B)$ needed for the driving method used or the driving frequency used is obtained, so that the present embodiment is widely applicable to various display devices.

The present embodiment is particularly suitably applicable to a high-definition active matrix substrate. As the definition increases, Cpi in formula (1) above deceases, and therefore the β value tends to increase, so that flicker tends to occur. In this case, the effect of reducing flicker through the formation of the additional parasitic capacitances Cx can be obtained more remarkably.

(Modifications)

Modifications of the active matrix substrate in the present embodiment will be described with reference to the drawings.

<Modification 1>

The plurality of pixel columns are arranged in the display region. In two pixel columns located at the opposite ends (the right and left ends) in the row direction, the parasitic capacitances such as the normal parasitic capacitances may differ from those in the other pixel columns. In modification 1, dummy traces are formed such that, even in the pixel columns at the ends, the balance between the own source and other source parasitic capacitances is the same as that in the other pixel columns.

Figure 4A:
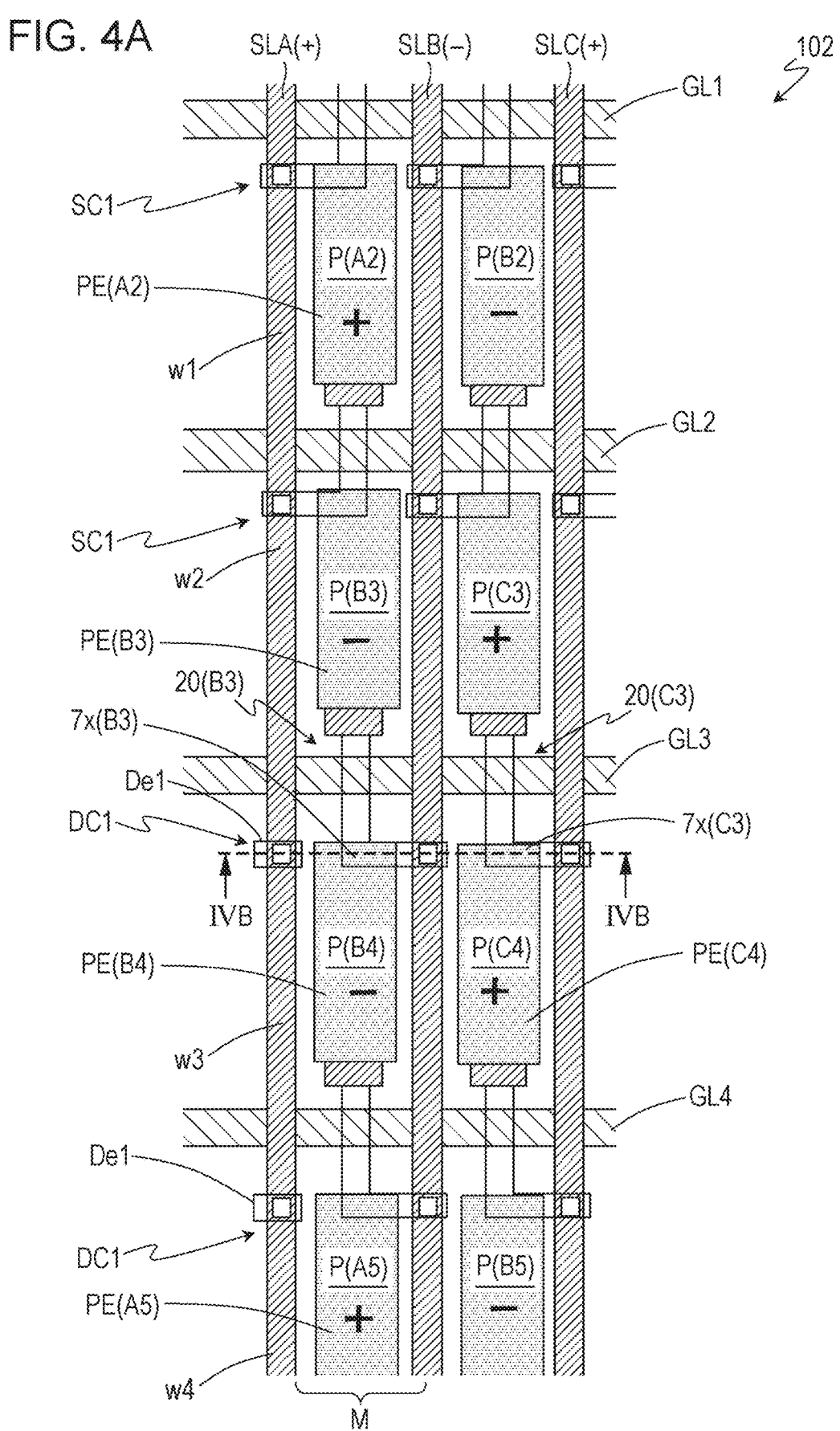
FIG. 4A is a plan view showing some pixel regions in an active matrix substrate in modification 1.
Figure 4B:
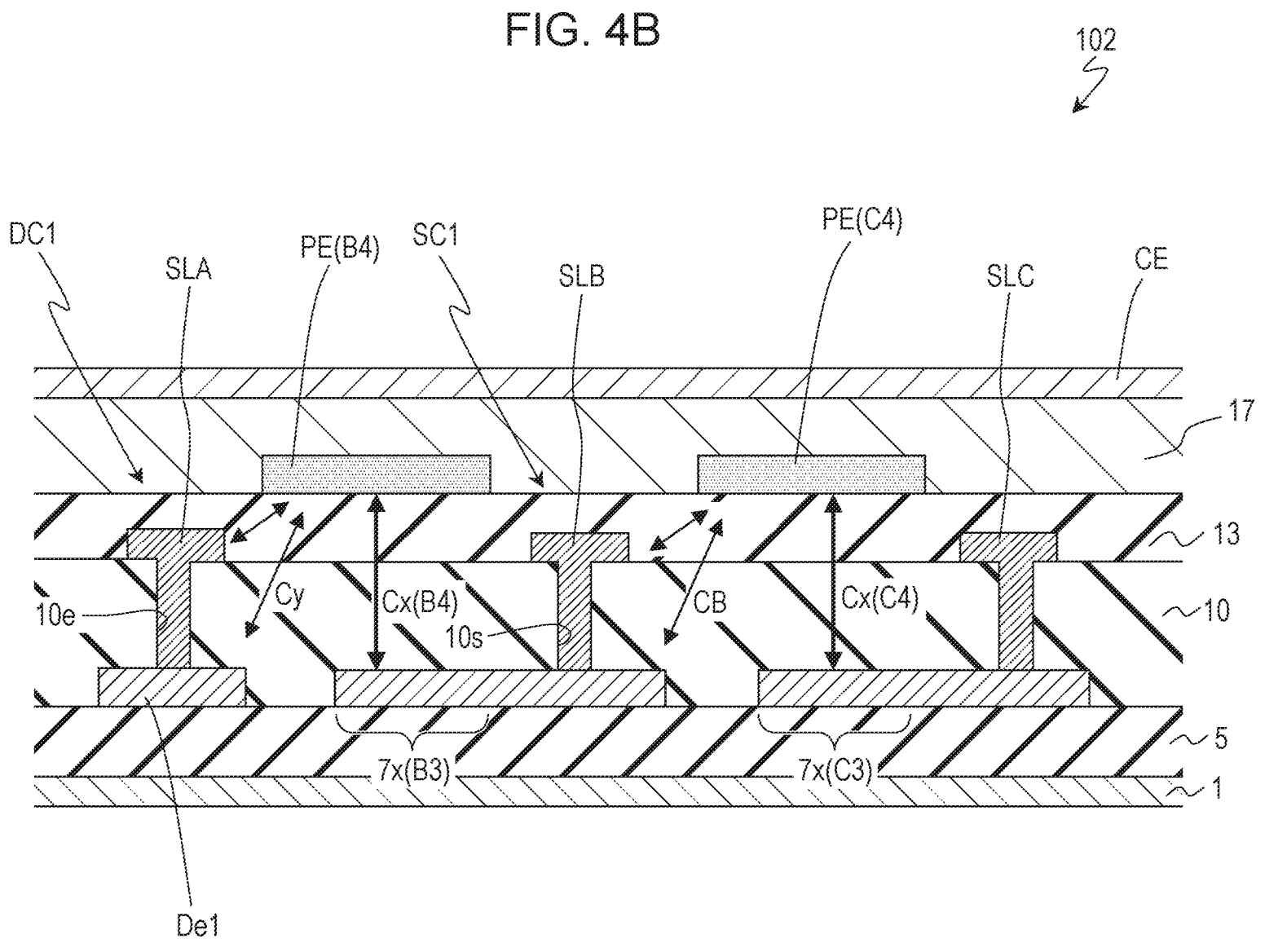

FIG. 4A is an enlarged plan view showing some pixel regions in an active matrix substrate 102 in modification 1. FIG. 4B is a cross-sectional view taken along line IVB-IVB in FIG. 4A. In the following figures, the same components as those in FIGS. 2A and 2B are denoted by the same reference symbols. Description of similar components will be appropriately omitted.

FIG. 4A shows three source bus lines SLA to SLC including the end source bus line SLA located at one end in the row direction (the left end in this example), four gate bus lines GL1 to GL4, and eight pixel regions P defined by these bus lines. A pixel column M between the end source bus line SLA and the source bus line SLB on the inner side is referred to as an "end pixel column." In FIG. 4A also, a pixel region associated with the source bus line SLk and the gate bus line GLj is denoted as a pixel region P(kj).

The active matrix substrate 102 in the present modification includes a plurality of islands of a first dummy metal oxide layer De1 that are spaced part from each other and a plurality of first dummy contact portions DC1.

When viewed in the direction normal to the substrate 1, each of the islands of the first dummy metal oxide layer De1 is an island trace disposed so as to at least partially overlap the end source bus line SLA. The first dummy metal oxide layer De1 is formed from the same oxide semiconductor film as that forming the oxide semiconductor layer 7 in the TFTs 20. The islands of the first dummy metal oxide layer De1 are disposed so as to be spaced apart from any portion of the oxide semiconductor layer 7. The specific resistance of the first dummy metal oxide layer De1 may be substantially the same as that of the low resistance regions of the oxide semiconductor layer 7. For example, the first dummy metal oxide layer De1 may be an electrically conductive layer.

The islands of the first dummy metal oxide layer are electrically connected to the end source bus line SLA at the respective first dummy contact portions DC1. In this example, the islands of the first dummy metal oxide layer De1 are electrically connected to the end source bus line SLA within respective openings 10e formed in the interlayer insulating layer 10.

In addition to the first dummy contact portions DC1, source contact portions SC (referred to as first source contact portions SC1) for connection to their respective TFTs 20 are disposed in the end source bus line SLA.

In the example illustrated, the end source bus line SLA includes a plurality of portions w1 to w4 located between the plurality of gate bus lines GL, and the first dummy contact portions DC1 are disposed in respective ones of these portions on which no first source contact portion SC1 is disposed (the portions w3 and w4 in this example). Pairs of first dummy contact portions DC1 and pairs of first source contact portions SC1 may be arranged alternately every two pixel rows (every two portions w).

In this structure, among the pixel electrodes PE located in the end pixel column M, pixel electrodes that are not adjacent to the first source contact portions SC1 can be adjacent to the respective first dummy contact portions DC1. In the illustrated example, pixel electrodes PE(A2) and PE(B3) in the end pixel column M are adjacent to respective first source contact portions SC1. However, pixel electrodes PE(B4) and PE(A5) are not adjacent to any first source contact portions SC1 but are adjacent to the respective first dummy contact portions DC1. By disposing the first dummy contact portions DC1, the balance between the other source parasitic capacitance and the own source parasitic capacitance can be adjusted even in the pixel regions P in the end pixel column M in the same manner as that for the other pixel columns.

Referring to FIG. 4B, a more specific description will be given. In a pixel electrode in a pixel column other than the end pixel column (the pixel electrode PE(C4) in this example), a normal parasitic capacitance (normal parasitic capacitance CB in this example) is formed between the pixel electrode PE(C4) and the oxide semiconductor layer 7 in the pixel region P(B3) adjacent in an obliquely upward direction. However, since no TFT is disposed in an oblique upward direction of a pixel electrode PE in the end pixel column M (the pixel electrode PE(B4) in this example), the normal parasitic capacitance CB of the pixel region P(B4) is smaller than that of the pixel region P(C4). The shortage of the parasitic capacitance (the shortage of the other source parasitic capacitance in this example) can be compensated for by parasitic capacitance Cy due to an oblique electric field formed between the pixel electrode PE(B4) and the first dummy metal oxide layer De1.

Figure 5:
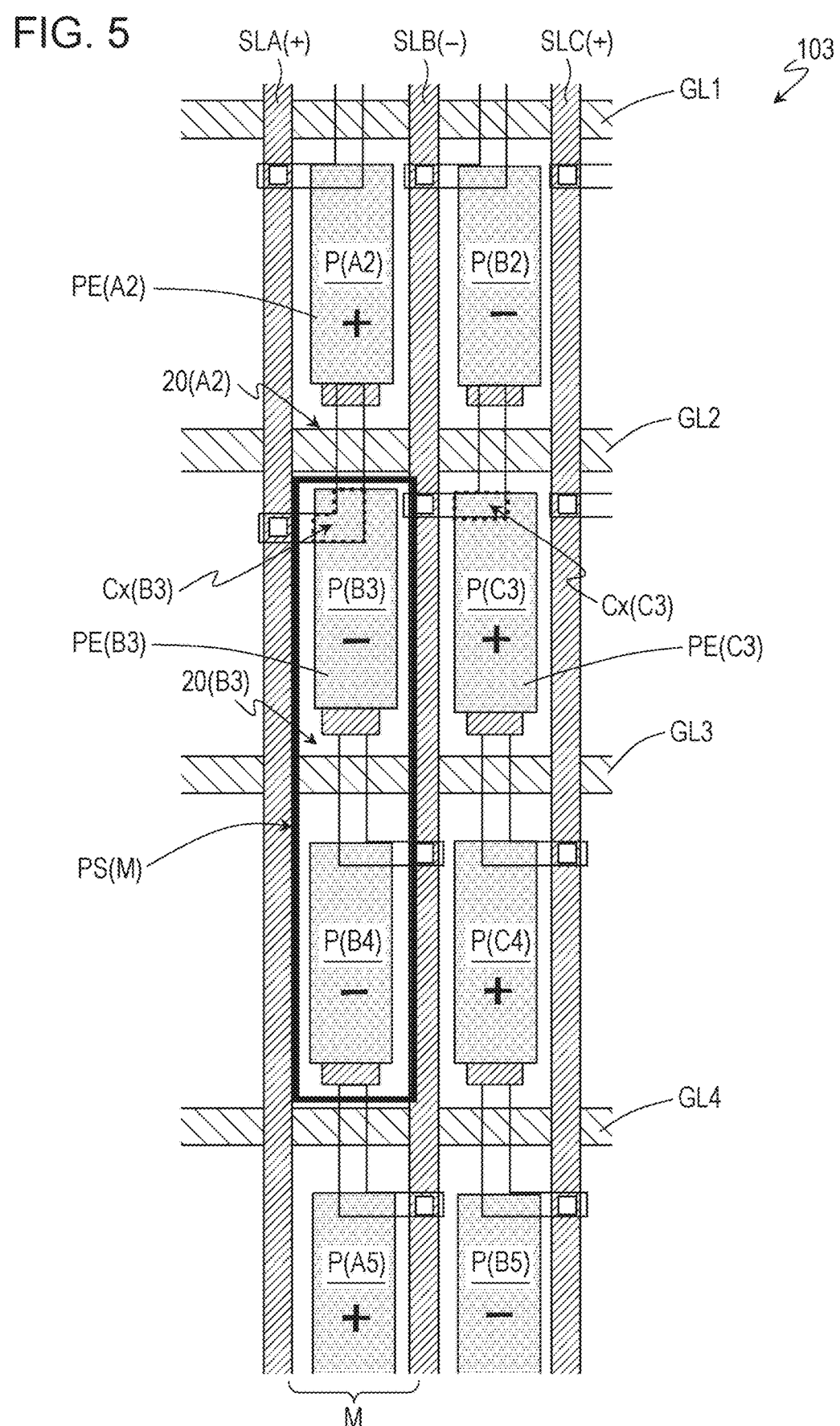
FIG. 5 is a plan view showing another active matrix substrate in modification 1.

FIG. 5 is a plan view for explaining another active matrix substrate 103 in modification 1.

In FIG. 5, the area for an additional parasitic capacitance Cx formed in a pixel set PS(M) in the end pixel column M differs from the area for an additional parasitic capacitance Cx formed in each of the pixel sets PS in the other pixel columns. The shortage of the parasitic capacitance in some pixel regions in the end pixel column M may be compensated for in the manner described above.

In this example, in a pixel set PS(M) including a pixel region P(B3) and a pixel region P(B4), the area for the additional other source parasitic capacitance Cx(B3) of the pixel region P(B3) is larger than the area for the additional other source parasitic capacitance (for example, Cx(C3)) of another pixel set such that the shortage of the normal parasitic capacitance (the normal parasitic capacitance CB in this case) of the pixel region P(B4) is compensated for. In this manner, the β value of the pixel set PS(M) can be set to substantially the same value as that of the pixel sets in other pixel columns.

<Modification 2>

The plurality of pixel rows are arranged in the display region. In a pixel low located at one side end (the upper or lower end) in the column direction, no additional parasitic capacitance Cx is formed in each pixel region. Accordingly, in modification 2, dummy traces are formed in the end pixel rows such that the same additional parasitic capacitances as those in the other pixel columns are obtained.

Figure 6A:
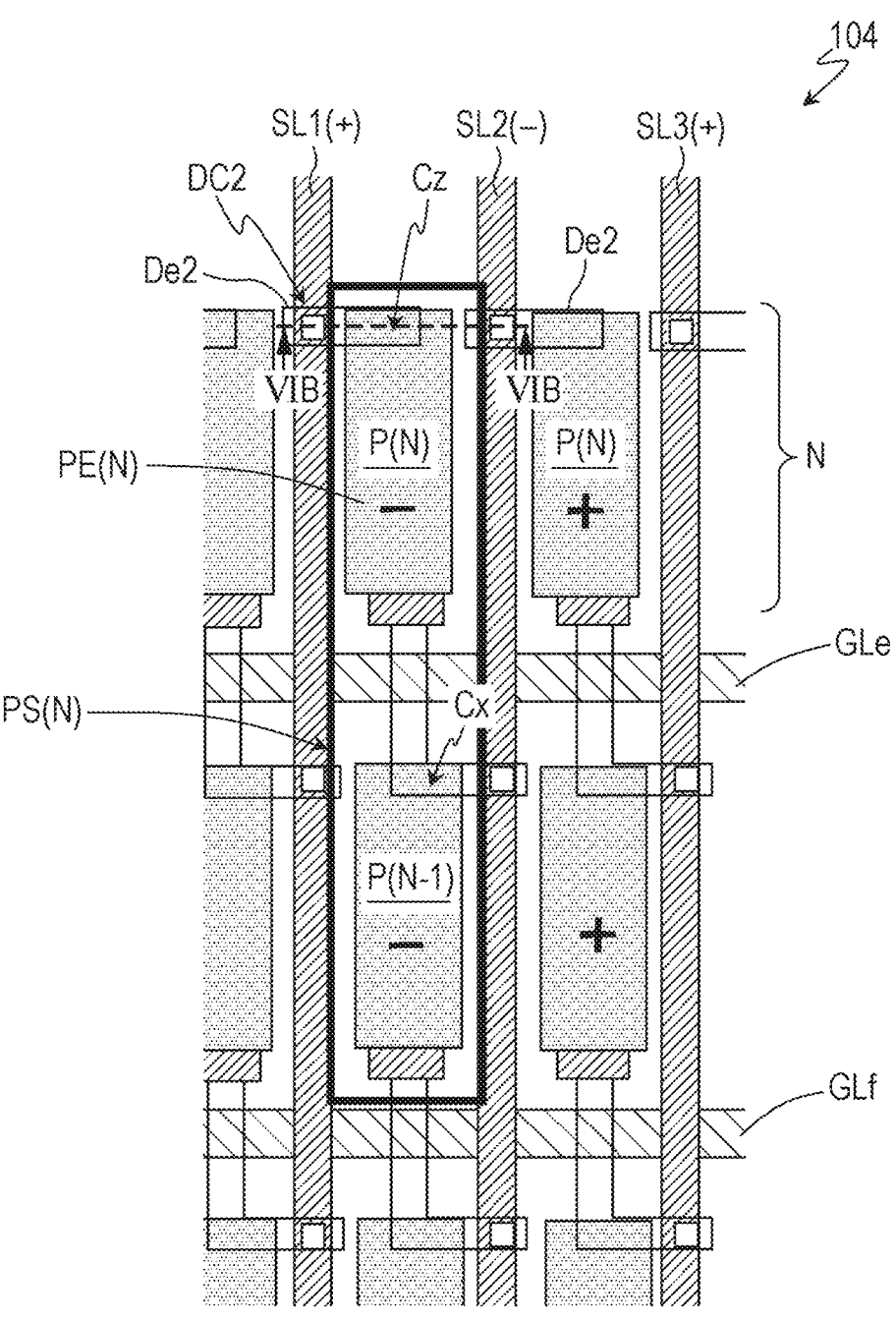
FIG. 6A is a plan view showing some pixel regions in an active matrix substrate in modification 2.
Figure 6B:
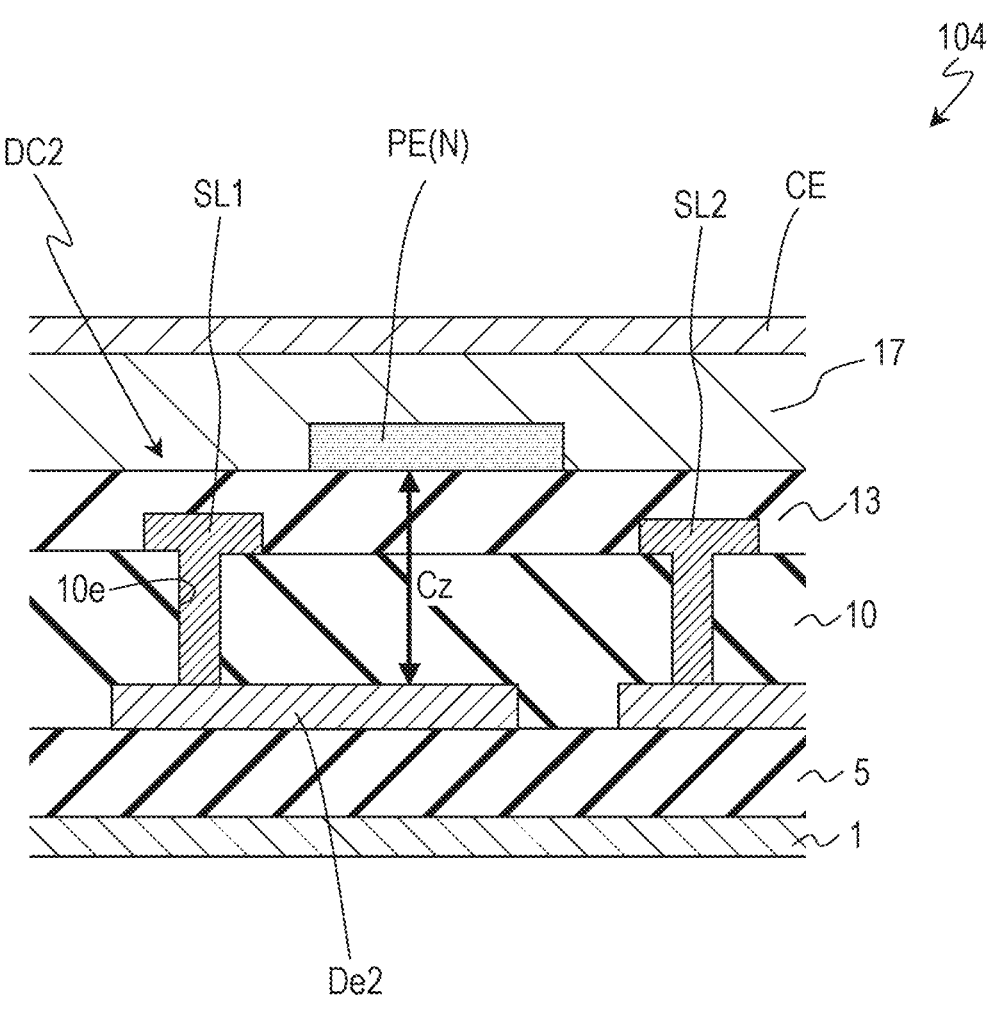
FIG. 6B is a cross-sectional view taken along line VIB-VIB in FIG. 6A.

FIG. 6A is an enlarged plan view showing some pixel regions in an active matrix substrate 104 in modification 2. FIG. 6B is a cross-sectional view taken along line VIB-VIB in FIG. 6A.

FIG. 6A shows an end gate bus line GLe located at an end in the column direction (the upper end in this example), a gate bus line GLf located on the inner side, three source bus lines SL1 to SL3, and a plurality of pixel regions P defined by these bus lines. A pixel row N located on one side of the end gate bus line GLe that is opposite to the gate bus line GLf is referred to as an "end pixel row," and a plurality of pixel regions P(N) located in the end pixel row N are referred to as "end pixel regions."

The active matrix substrate 104 in the present modification includes a plurality of islands of a second dummy metal oxide layer De2 that are spaced apart from each other and a plurality of second dummy contact portions DC2.

Each of the islands of the second dummy metal oxide layer De2 is electrically connected to a corresponding one of the plurality of source bus lines SL at a corresponding one of the second dummy contact portions DC2. Each of the islands of the second dummy metal oxide layer De2 partially overlaps a corresponding one of the pixel electrodes PE(N) of the end pixel regions P(N) through insulating layers (the interlayer insulating layer 10 and the upper insulating layer 13 in this case). In this manner, additional parasitic capacitances Cz are formed in the end pixel regions P(N).

The second dummy metal oxide layer De2 is formed from the same oxide semiconductor film as that forming the oxide semiconductor layer 7 in the TFTs 20 of the pixel regions P. The islands of the second dummy metal oxide layer De2 are disposed so as to be spaced apart from any portion of the oxide semiconductor layer 7. The specific resistance of the second dummy metal oxide layer De2 may be substantially the same as that of the low resistance regions of the oxide semiconductor layer 7 (i.e., the second dummy metal oxide layer De2 may be a conductor).

Each pixel column includes a pixel set PS(N) including an end pixel region P(N) and a pixel region P(N−1) adjacent to the end pixel region P(N) in the column direction. In each pixel set PS(N), the additional parasitic capacitance Cz of the end pixel region P(N) (the additional other source parasitic capacitance in this example) and the additional parasitic capacitance Cx of the pixel region P(N−1) (the additional own source parasitic capacitance in this example) can cancel each other out. Therefore, the β value of the pixel set PS(N) can be controlled.

Figure 7:
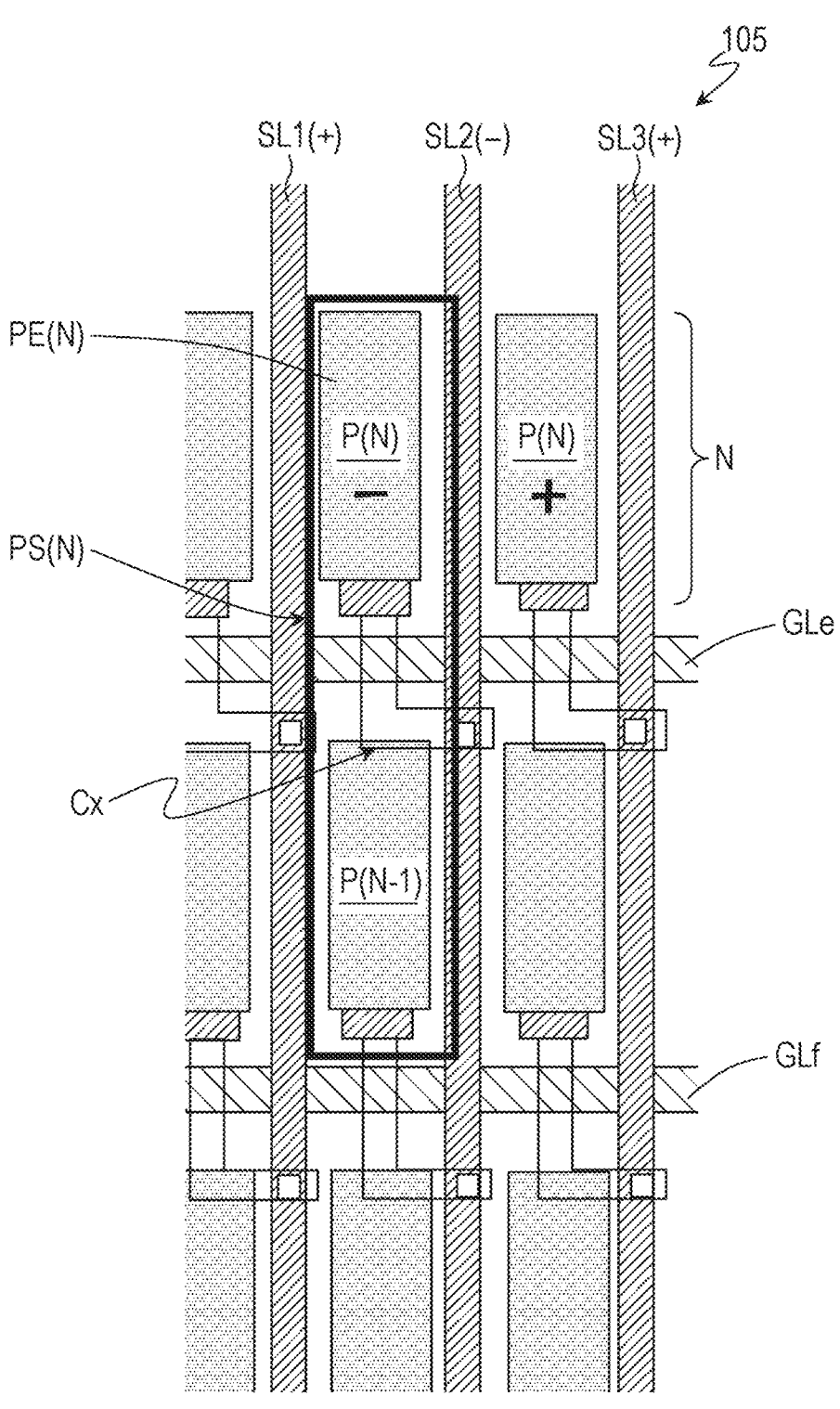
FIG. 7 is a plan view showing some pixel regions in another active matrix substrate in modification 2.

FIG. 7 is a plan view for explaining another active matrix substrate 105 in modification 2.

As exemplified in FIG. 7, in each pixel set PS(N), the additional parasitic capacitance Cx formed in the pixel region (N−1) (the additional own source parasitic capacitance in this example) may be smaller than the additional own source parasitic capacitances in other pixel sets. In this case, the balance between the other source and own source parasitic capacitances in each pixel set PS(N) can be adjusted, so that the absolute value of the β value of the pixel set PS(N) can be reduced.

The active matrix substrate in the present embodiment can have both the structure in modification 1 and the structure in modification 2. For example, both the first dummy metal oxide layer De1 in modification 1 and the second dummy metal oxide layer De2 in modification 2 may be formed in the active matrix substrate. In this case, the occurrence of flicker can be reduced more effectively over the entire display region.

(Method for Producing Active Matrix Substrate)

Next, an example of a method for producing the active matrix substrate in the present embodiment will be described using the active matrix substrate 101 shown in FIGS. 2A to 2C as an example. FIG. 8 is a diagram showing a process flow explaining the example of the method for producing the active matrix substrate 101. The active matrix substrates 103 and 105 can also be produced using a similar method with the arrangement and shapes of the pixel electrodes PE in some pixel regions P and the oxide semiconductor layer 7 changed appropriately. When the active matrix substrate 102 or 104 is produced, the oxide semiconductor film for the oxide semiconductors TFT may be used to form semiconductor patterns serving as the first and second dummy metal oxide layers (collectively referred to as a "dummy metal oxide layer" in the following description).

Step 1: Formation of Conductive Layer 3

A first conductive film (thickness: for example, from 50 nm to 500 nm inclusive) is formed on the substrate 1 using, for example, a sputtering method. Next, a known photolithographic process is used to pattern the first conductive film (for example, by wet etching) to thereby form a lower metal layer including a plurality of islands of the conductive layer 3. The conductive layer 3 serves as a light shield layer for the pixel TFTs.

The substrate 1 used may be a transparent insulating substrate such as a glass substrate, a silicon substrate, a heat-resistant plastic substrate (resin substrate), etc.

No particular limitation is imposed on the material of the first conductive film, and a film containing a metal such as aluminum (Al), tungsten (W), molybdenum (Mo), tantalum (Ta), chromium (Cr), titanium (Ti), or copper (Cu), an alloy thereof, or a metal nitride thereof may be appropriately used. A layered film obtained by stacking a plurality of films may also be used.

Step 2: Formation of Lower Insulating Layer 5

Next, the lower insulating layer 5 (thickness: for example, from 200 nm to 600 nm inclusive) is formed so as to cover the lower metal layer.

The lower insulating layer 5 is formed, for example, by a CVD method. A silicon oxide (SiOx) layer, a silicon nitride (SiNx) layer, a silicon oxide nitride (SiOxNy:x>y) layer, a silicon nitride oxide (SiNxOy:x>y) layer, etc. may be appropriately used as the lower insulating layer 5. The lower insulating layer 5 may be a monolayer or may have a layered structure. For example, a silicon nitride (SiNx) layer, a silicon nitride oxide layer, etc. may be formed on the substrate side (as a lower layer) in order to reduce diffusion of impurities etc., and a silicon oxide ($SiO_2$) layer, a silicon oxide nitride layer, etc. may be formed on the formed layer (as an upper layer) in order to obtain insulation. In this example, a layered film including a silicon nitride (SiNx) layer (thickness: 50 to 600 nm) serving as the lower layer and a silicon oxide ($SiO_2$) layer (thickness: 50 to 600 nm) serving as the upper layer may be formed as the lower insulating layer 5. When an oxide layer such as a silicon oxide film is used as the lower insulating layer 5 (as the uppermost layer when the lower insulating layer has a layered structure), the oxide film can reduce oxygen deficiency in the channel regions in the oxide semiconductor layer to be formed, and a reduction in the resistance of the channel regions can be avoided.

Step 3: Formation of Oxide Semiconductor Layer 7

Next, an oxide semiconductor film is formed on the lower insulating layer 5. Then the oxide semiconductor film may be subjected to annealing treatment. The thickness of the oxide semiconductor film may be, for example, from 15 nm to 200 nm inclusive.

Next, a known photolithographic process is used to pattern the oxide semiconductor film. The oxide semiconductor film may be patterned by wet etching using, for example, a PAN-based etching solution containing phosphoric acid, nitric acid, and acetic acid or an oxalic acid-based etching solution. A plurality of islands of the oxide semiconductor layer 7 are thereby obtained. The oxide semiconductor layer 7 serves as the active layer of each pixel TFT. By patterning the oxide semiconductor film, a plurality of islands of a dummy semiconductor layer used as a dummy metal oxide layer may be formed in addition to the plurality of islands of the oxide semiconductor layer 7.

The oxide semiconductor film may be formed, for example, by a sputtering method. In this example, the oxide semiconductor film formed is an In—Ga—Zn—O-based semiconductor film (thickness: about 50 nm) containing In, Ga, and Zn.

Step 4: Formation of Gate Insulating Layer and Gate Metal Layer

Next, a gate insulating film (thickness: for example, from 80 nm to 250 nm inclusive) and a gate conductive film (thickness: for example, from 50 nm to 500 nm inclusive) are formed in this order so as to cover the oxide semiconductor layer 7 in each of the pixel TFTs.

The gate insulating film used may be the same insulating film as that used for the lower insulating layer 5 (any of the insulating films exemplified for the lower insulating layer 5). In this example, a silicon oxide ($SiO_2$) layer is formed as the gate insulating film. When an oxide film such as a silicon oxide film is used as the insulating film, the oxide film can reduce oxygen deficiency in the channel regions in the oxide semiconductor layer 7, and a reduction in the resistance of the channel regions can be avoided.

A metal such as molybdenum (Mo), tungsten (W), aluminum (Al), copper (Cu), titanium (Ti), or tantalum (Ta) or an alloy thereof may be used for the gate conductive film. The gate conductive film may have a layered structure including a plurality of layers formed of different conductive materials. In this example, the gate conductive film used is a Cu/Ti layered film including a Ti film as a lower layer and a Cu film as an upper layer or a Cu/Mo layered film including a Mo film as a lower layer and a Cu film as an upper layer.

Then a resist layer is formed on the gate conductive film, and the gate conductive film is patterned using the resist layer as a mask to thereby form a gate metal layer including the gate electrodes GE of the pixel TFTs and a plurality of gate bus lines GL. Next, the gate insulating film is etched using the resist layer or the gate metal layer as a mask, and the gate insulating layer 9 in each pixel TFT is thereby obtained. In this manner, regions of the oxide semiconductor layer 7 that overlap the gate electrodes GE with the gate insulating layer 9 interposed therebetween become the channel regions 7c.

Step 5: Resistance Reduction Treatment of Oxide Semiconductor Layer 7 and Formation of Interlayer Insulating Layer 10

Next, the oxide semiconductor layer 7 may be subjected to resistance reduction treatment to form low-resistance regions. The resistance reduction treatment performed may be, for example, plasma treatment. In this manner, exposed regions of the oxide semiconductor layer 7 that are located on opposite sides of the channel regions 7c when viewed in the direction normal to the principal surface of the substrate 1 become low-resistance regions having a lower specific resistance than the channel regions 7c. The low-resistance regions may be conductor regions (for example, sheet resistance: 200 Ω/square or less). The low-resistance regions include first regions 7s located on the source side of the channel regions 7c and second regions 7d located on the drain side.

When the plurality of islands of the dummy semiconductor layer have been formed, the resistance reduction treatment may be used to reduce the resistance of the dummy semiconductor layer. In this manner, the dummy metal oxide layer obtained has a low resistance.

Next, the interlayer insulating layer 10 is formed so as to cover the oxide semiconductor layer 7, the gate insulating layer 9, and the gate metal layer in each pixel TFT. The interlayer insulating layer 10 may be formed as an inorganic insulating monolayer such as a silicon oxide film, a silicon nitride film, a silicon oxide nitride film, or a silicon nitride oxide or a stack of any of these layers. The thickness of the inorganic insulating layer may be from 100 nm to 500 nm inclusive. When the interlayer insulating layer 10 is formed using an insulating film such as a silicon nitride film that reduces an oxide semiconductor, the specific resistance of regions of the oxide semiconductor layer 7 that are in contact with the interlayer insulating layer 10 (the low-resistance regions in this case) may be kept low. In this example, for example, a layered film including a $SiO_2$ layer as a lower layer and a SiNx layer as an upper layer may be formed as the interlayer insulating layer 10 by a CVD method.

The exposed regions of the oxide semiconductor layer 7 may be subjected to the following resistance reduction treatment instead of the plasma treatment. Specifically, the exposed regions of the oxide semiconductor layer 7 are brought into contact with an interlayer insulating layer 10 including an insulating film such as a silicon nitride film that reduces the oxide semiconductor.

Then, for example, dry etching is performed to pattern the interlayer insulating layer 10. In this manner, the first openings 10s through which part of the first regions 7s of the oxide semiconductor layer 7 are exposed and the second openings 10d through which part of the second regions 7d are exposed are formed in the interlayer insulating layer 10. The openings 10e through which part of the dummy metal oxide layer is exposed may also be formed at this time.

Step 6: Formation of Source Metal Layer

Next, a source conductive film (thickness: for example, from 50 nm to 500 nm inclusive) is formed on the interlayer insulating layer 10 and patterned. In this manner, a source metal layer including the source electrode SE and the drain electrode DE of each pixel TFT and a plurality of source bus lines SL is formed. The TFTs 20 are thereby produced as pixel TFTs in the respective pixel regions.

For example, an element selected from aluminum (Al), chromium (Cr), copper (Cu), tantalum (Ta), titanium (Ti), molybdenum (Mo), and tungsten (W) or an alloy containing any of these elements may be used for the source conductive film. For example, a three-layer structure including a titanium film/an aluminum film/a titanium film or a three-layer structure including a molybdenum film/an aluminum film/a molybdenum film may be used. In this example, a layered film including a Ti film (thickness: 15 to 70 nm) serving as a lower layer and a Cu film (thickness: 200 to 400 nm) serving as an upper layer may be used.

Step 7: Formation of Upper Insulating Layer 13

Next, the upper insulating layer 13 is formed so as to cover the interlayer insulating layer 10 and the source metal layer. In this example, an inorganic insulating layer (thickness: for example, from 100 nm to 500 nm inclusive) and an organic insulating layer (thickness: for example, 1 to 3 μm and preferably 2 to 3 μm) are formed in this order as the upper insulating layer 13. The entire portion of the organic insulating layer that is located in a non-display region may be removed. Alternatively, the organic insulating layer may not be formed.

The inorganic insulating layer used may be the same inorganic insulating film as that used for the interlayer insulating layer 10 (any of the insulating films exemplified for the interlayer insulating layer 10). In this example, for example, a SiNx layer (thickness: about 300 nm) is formed as the inorganic insulating layer by a CVD method. The organic insulating layer may be an organic insulating film (for example, an acrylic-based resin film) containing a photosensitive resin material.

Then the organic insulating layer is patterned. In this manner, openings through which part of the inorganic insulating layer is exposed are formed in the organic insulating layer at positions in the pixel regions P. Then the inorganic insulating layer is patterned using the organic insulating layer as a mask. In this manner, the pixel contact holes CHp through which part of the drain electrodes DE of the TFTs 20 are exposed are formed in the upper insulating layer 13.

Step 8: Formation of Pixel Electrodes PE

Next, a first transparent conductive film (thickness: 20 to 300 nm) is formed on the upper insulating layer 13 and in the pixel contact holes CHp. The material of the first transparent conductive film may be a metal oxide such as indium-tin oxide (ITO), indium-zinc oxide, or ZnO. Then the first transparent conductive film is patterned. For example, an oxalic acid-based etching solution may be used to subject the first transparent conductive film to wet etching. In this manner, the pixel electrodes PE are formed in the respective pixel regions P. In the pixel regions P, the pixel electrodes PE are connected to the drain electrodes DE of the respective TFTs 20 within the respective pixel contact holes CHp.

Step 9: Formation of Dielectric Layer 17

Next, the dielectric layer 17 (thickness: 50 to 500 nm) is formed so as to cover the pixel electrodes PE. The material of the dielectric layer 17 may be the same as any of the materials exemplified as the material of the inorganic insulating layer of the upper insulating layer 13. In this example, a SiN film, for example, is formed as the dielectric layer 17 by a CVD method.

Step 10: Formation of Common Electrode CE

Next, the common electrode CE is formed on the dielectric layer 17.

First, a second transparent conductive film (thickness: 20 to 300 nm) is formed on the dielectric layer 17. The material of the second transparent conductive film may be the same as any of the materials (for example, ITO) exemplified as the material of the first transparent conductive film. Then the second transparent conductive film is patterned. The patterning may be wet etching using, for example, an oxalic acid-based etching solution. The common electrode CE is thereby obtained. The common electrode CE has one or a plurality of slits (openings) or cutout portions for each pixel region P. The active matrix substrate 101 is thereby produced.

The method for producing the active matrix substrate in the present embodiment is not limited to the above method. It is only necessary that the bus lines, the pixel electrodes PE, the TFTs 20, etc. be arranged such that the absolute values of the β values of the pixel sets are within a prescribed range, and any other known production method can be used.

<Oxide Semiconductor>

The oxide semiconductor (referred to also as metal oxide or oxide material) contained in the oxide semiconductor layer in each TFT in the present embodiment may be an amorphous oxide semiconductor or may be a crystalline oxide semiconductor having a crystalline portion. Examples of the crystalline oxide semiconductor include polycrystalline oxide semiconductors, microcrystalline oxide semiconductors, and crystalline oxide semiconductors having a c-axis oriented substantially perpendicular to the layer surface.

The oxide semiconductor layer may have a layered structure including two or more layers. When the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. Alternatively, the oxide semiconductor layer may include a plurality of amorphous oxide semiconductor layers. When the oxide semiconductor layer has a two-layer structure including an upper layer and a lower layer, the energy gap of the oxide semiconductor contained in one of the two layers that is located on the gate electrode side (the lower layer in the bottom gate structure or the upper layer in the top gate structure) may be smaller than the energy gap of the oxide semiconductor contained in the layer opposite to the gate electrode (the upper layer in the bottom gate structure or the lower layer in the top gate structure). When the difference in the energy gap between these layers is relatively small, the energy gap of the oxide semiconductor in the layer on the gate electrode side may be larger than the energy gap of the oxide semiconductor located on the side opposite to the gate electrode.

The materials and structures of the amorphous oxide semiconductors and the crystalline oxide semiconductors, their deposition methods, the structure of the oxide semiconductor layer having a layered structure are described in, for example, Japanese Unexamined Patent Application Publication No. 2014-007399. The entire contents of the disclosure of Japanese Unexamined Patent Application Publication No. 2014-007399 are incorporated by reference for reference purposes.

The oxide semiconductor layer may contain, for example, at least one metal element selected from In, Ga, and Zn. In the present embodiment, the oxide semiconductor layer contains, for example, an In—Ga—Zn—O-based semiconductor (e.g., indium gallium zinc oxide). The In—Ga—Zn—O-based semiconductor is a ternary oxide of In (indium), Ga (gallium), and Zn (zinc). No particular limitation is imposed on the ratio (compositional ratio) of In, Ga, and Zn, and the compositional ratio may be, for example, In:Ga:Zn=2:2:1, In:Ga:Zn=1:1:1, or In:Ga:Zn=1:1:2. Such an oxide semiconductor layer may be formed from an oxide semiconductor film containing an In—Ga—Zn—O-based semiconductor.

The In—Ga—Zn—O-based semiconductor may be amorphous or crystalline. The crystalline In—Ga—Zn—O-based semiconductor may be a crystalline In—Ga—Zn—O-based semiconductor having a c-axis oriented substantially perpendicular to the layer surface.

The crystal structure of the crystalline In—Ga—Zn-0-based semiconductor is disclosed in Japanese Unexamined Patent Application Publication No. 2014-007399 described above, Japanese Unexamined Patent Application Publication No. 2012-134475, Japanese Unexamined Patent Application Publication No. 2014-209727, etc. The entire contents of the disclosures of Japanese Unexamined Patent Application Publication No. 2012-134475 and Japanese Unexamined Patent Application Publication No. 2014-209727 are incorporated by reference for reference purposes. TFTs including an In—Ga—Zn—O-based semiconductor layer have a high mobility (higher by a factor of 20 or more than that in a-Si TFTs) and a low leakage current (lower than 1/100 that in a-Si TFTs) and are therefore suitably used as driving TFTs (for example, TFTs that are included in a driving circuit disposed on a substrate having a display region including a plurality of pixels and are located in a portion around the display region) and pixel TFTs (TFTs disposed in pixels).

The oxide semiconductor layer may contain a different oxide semiconductor instead of the In—Ga—Zn—O-based semiconductor. For example, the oxide semiconductor layer may contain an In—Sn—Zn—O-based semiconductor (e.g., $In_2O_3$—$SnO_2$—ZnO:InSnZnO). The In—Sn—Zn—O-based semiconductor is a ternary oxide of In (indium), Sn (tin), and Zn (zinc). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, etc.

The embodiments of the present disclosure are suitably applicable to active matrix substrates and more particularly to high-definition active matrix substrates. Such active matrix substrates are applied to display devices such as liquid crystal display devices, organic electroluminescent (EL) display devices, and inorganic electroluminescent (EL) display devices, imaging devices such as image sensors, and various electronic devices such as image input devices, fingerprint readers, and semiconductor memories.

The present disclosure contains subject matter related to that disclosed in Japanese Priority Patent Application JP 2021-145486 filed in the Japan Patent Office on Sep. 7, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
a substrate having a plurality of pixel regions arranged in a row direction and a column direction in a matrix form;
a plurality of gate bus lines supported on the substrate and extending in the row direction; and
a plurality of source bus lines supported on the substrate and extending in the column direction,
wherein each of the pixel regions is defined by corresponding adjacent two of the gate bus lines and corresponding adjacent two of the source bus lines,
wherein the each of the pixel regions includes a pixel electrode and an oxide semiconductor TFT including an oxide semiconductor layer serving as an active layer, the pixel electrode being electrically connected to a first one of the corresponding adjacent two of the source bus lines through the oxide semiconductor TFT,
wherein the plurality of source bus lines include a first source bus line and a second source bus line that are adjacent to each other, wherein pixels sets each including two of the pixel regions whose pixel electrodes are electrically connected to the first source bus line and pixel sets each including two of the pixel regions whose pixel electrodes are electrically connected to the second source bus line are arranged alternately between the first source bus line and the second source bus line, wherein $\beta(A-B)$ that is a $\beta$ value of the each of the pixel regions is determined from formula (1) below using own source parasitic capacitance $Csd(A)$ formed between the pixel electrode of the each of the pixel regions and the first one of the corresponding adjacent two of the source bus lines, other source parasitic capacitance $Csd(B)$ formed between the pixel electrode of the each of the pixel regions and a second one of the corresponding adjacent two of the source bus lines, and pixel capacitance $Cpi$:

$$\beta(A-B) = \{Csd(A) - Csd(B)\}/Cpi, \text{ and} \qquad (1)$$

wherein each of the pixel sets is designed such that $$\beta_1(A-B) > 0,$$

$$\beta_2(A-B) < 0, \text{ and}$$

$$|\beta_1(A-B) + \beta_2(A-B)| \leq 0.001$$

are satisfied, where $\beta_1(A-B)$ and $\beta_2(A-B)$ are $\beta$ values of the respective two pixel regions in the each of the pixel sets.

2. The active matrix substrate according to claim 1, wherein the each of the pixel sets is designed such that $\beta_1(A-B)$ and $\beta_2(A-B)$ that are the $\beta$ values of the two pixel regions satisfy $$|\beta_1(A-B)| > 0.001 \text{ and}$$

$$|\beta_2(A-B)| > 0.001.$$

* * * * *